United States Patent
Lee et al.

(10) Patent No.: US 9,543,316 B2
(45) Date of Patent: Jan. 10, 2017

(54) SEMICONDUCTOR MEMORY DEVICE AND METHOD OF FABRICATING THE SAME

(71) Applicants: Hyunmin Lee, Seoul (KR); Changseok Kang, Seongnam-si (KR); Jongwon Kim, Hwaseong-si (KR); Hyeong Park, Hwaseong-si (KR)

(72) Inventors: Hyunmin Lee, Seoul (KR); Changseok Kang, Seongnam-si (KR); Jongwon Kim, Hwaseong-si (KR); Hyeong Park, Hwaseong-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/668,938

(22) Filed: Mar. 25, 2015

(65) Prior Publication Data

US 2016/0043100 A1   Feb. 11, 2016

(30) Foreign Application Priority Data

Aug. 7, 2014   (KR) .......................... 10-2014-0101761

(51) Int. Cl.
*H01L 27/115*   (2006.01)
*H01L 23/535*   (2006.01)

(52) U.S. Cl.
CPC ....... *H01L 27/11582* (2013.01); *H01L 23/535* (2013.01); *H01L 27/11565* (2013.01); *H01L 2924/0002* (2013.01)

(58) Field of Classification Search
CPC .................... H01L 27/11524; H01L 27/11529; H01L 27/1157; H01L 23/535; H01L 27/11565; H01L 27/11582

USPC   257/261, 296, 324, 225, 314, 326; 438/216, 287, 266
See application file for complete search history.

(56) References Cited

U.S. PATENT DOCUMENTS

| | | | |
|---|---|---|---|
| 7,714,376 B2 | 5/2010 | Lee et al. | |
| 8,581,323 B2 | 11/2013 | Uenaka et al. | |
| 8,648,404 B2 | 2/2014 | Ko et al. | |
| 9,005,473 B2* | 4/2015 | Kiehlbauch | 252/79.3 |
| 2003/0123013 A1* | 7/2003 | Han | G02F 1/13452 349/149 |
| 2008/0142867 A1 | 6/2008 | Lee et al. | |

(Continued)

FOREIGN PATENT DOCUMENTS

| KR | 100371836 B1 | 2/2003 |
|---|---|---|
| KR | 20110001527 A | 1/2011 |

(Continued)

*Primary Examiner* — Jarrett Stark
*Assistant Examiner* — Shahed Ahmed
(74) *Attorney, Agent, or Firm* — Renaissance IP Law Group LLP

(57) ABSTRACT

Inventive concepts provide semiconductor memory devices and methods of fabricating the same. A stack structure and vertical channel structures are provided on a substrate. The stack structure includes insulating layers and gate electrodes alternately and repeatedly stacked on the substrate. The vertical channel structures penetrate the stack structure. Conductive pads are disposed on the vertical channel structures. An etch stopper covers sidewalls of the conductive pads. Pad contacts are disposed on the conductive pads to be in contact with the conductive pads. The pad contacts are further in contact with the etch stopper.

20 Claims, 25 Drawing Sheets

(56) References Cited

U.S. PATENT DOCUMENTS

| | | | |
|---|---|---|---|
| 2010/0019345 A1* | 1/2010 | Willer | H01L 21/28273 257/522 |
| 2011/0169071 A1 | 7/2011 | Uenaka et al. | |
| 2011/0298038 A1 | 12/2011 | Son et al. | |
| 2012/0003831 A1 | 1/2012 | Kang et al. | |
| 2012/0112264 A1* | 5/2012 | Lee | H01L 27/11551 257/324 |
| 2012/0319173 A1 | 12/2012 | Ko et al. | |
| 2013/0043509 A1 | 2/2013 | Cho et al. | |
| 2013/0168752 A1 | 7/2013 | Kim et al. | |
| 2013/0270625 A1* | 10/2013 | Jang | H01L 29/7926 257/324 |
| 2015/0294978 A1* | 10/2015 | Lu | H01L 27/1157 438/269 |

FOREIGN PATENT DOCUMENTS

| | | |
|---|---|---|
| KR | 20110132865 A | 12/2011 |
| KR | 20120003677 A | 1/2012 |

\* cited by examiner

SEMICONDUCTOR MEMORY DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0101761, filed on Aug. 7, 2014, in the Korean Intellectual Property Office, the disclosure of which is hereby incorporated by reference in its entirety.

BACKGROUND

The inventive concepts relate to semiconductor memory devices and method of fabricating the same.

Semiconductor devices become more highly integrated to provide high performance semiconductor devices at low costs. The integration density of semiconductor memory device directly affects the costs of the semiconductor memory device, thereby resulting in more demands of highly-integrated semiconductor memory devices. The integration density of a conventional two-dimensional (2D) or planar semiconductor memory device is mainly determined by an area which a unit cell occupies. Therefore, the integration density of the conventional 2D semiconductor memory device is greatly affected by a technique of forming fine patterns. However, since the fine patterns are formed using extremely high-priced apparatuses, the integration intensity of the 2D semiconductor memory device continues to increase but still is limited. Thus, various researches are being conducted for a semiconductor memory device including memory cells that are vertically arranged.

SUMMARY

Embodiments of the inventive concepts may provide a high-quality and highly reliable semiconductor memory device.

Embodiments of the inventive concepts may also provide methods of fabricating such a semiconductor memory device.

In one aspect, semiconductor memory device may include stack structures arranged in a first direction, each of the stack structures including insulating layers and gate electrodes alternately and repeatedly stacked on the substrate, vertical channel structures each penetrating a corresponding one of the stack structures, conductive pads being in contact with the vertical channel structures, each of the conductive pads disposed on a corresponding one of the vertical channel structures, and an etch stopper covering sidewalls of the conductive pads and exposing top surfaces of the conductive pads. The etch stopper may be an isolated pattern on a corresponding one of the stack structures.

In some embodiments, each of the vertical channel structures may include a tunnel dielectric layer, a charge storage layer, and a vertical channel pattern.

In some embodiments, the vertical channel pattern may include a first vertical channel pattern protruding upwardly from the substrate and a second vertical channel pattern on the first vertical pattern. The tunnel dielectric layer and the charge storage layer may be disposed between the second vertical channel pattern and each of the stack structures.

In some embodiments, when viewed in plan view, the etch stopper may include a non-linear perimeter such as a wavy perimeter.

In some embodiments, the etch stopper may include silicon nitride.

In some embodiments, the etch stopper may fill a space between inner sidewalls of the conductive pads and have a spacer shape on outer sidewalls of the conductive pads.

In some embodiments, the etch stopper may include a plurality of etch stopper patterns on outer sidewalls of the conductive pads.

In some embodiments, the semiconductor memory device may further comprise pad contacts in contact with the conductive pads and the etch stopper.

In another aspect, a semiconductor memory device may include stack structures arranged in a first direction, each of the stack structures including insulating layers and gate electrodes that are alternately and repeatedly stacked on a substrate, vertical channel structures each penetrating a corresponding one of the stack structures, conductive pads being in contact with the vertical channel structures, each of the conductive pads disposed on a corresponding one of the vertical channel structures, and a trench extending in a second direction intersecting the first direction between the stack structures, a common source plug in the trench, and an etch stopper on each of the stack structures. The etch stopper may be horizontally spaced apart from the trench and covering a portion of the conductive pads in the first and second directions.

In some embodiments, each of the vertical channel structures may include a first vertical channel pattern protruding upwardly from the substrate, a second vertical channel pattern on the first vertical channel, a tunnel dielectric layer, a charge storage layer and a blocking insulating layer. The tunnel dielectric layer, the charge storage layer and the blocking insulating layer may be disposed between the second vertical pattern and the stack structures.

In some embodiments, the etch stopper may cover sidewalls of the conductive pads and have a non-linear perimeter such as a wavy perimeter, when viewed in plan view.

In some embodiments, the etch stopper covers top surfaces of the conductive pads and has a linear perimeter, when viewed in plan view.

In some embodiments, the semiconductor may further comprise pad contacts being in contact with the conductive pads and the etch stopper.

In some embodiments, each of the pad contacts may be in contact with a top surface and sidewalls of each of the conductive pads and a portion of the etch stopper.

In some embodiments, the etch stopper may fill a space between inner sidewalls of the conductive pads and have a spacer shape on outer sidewalls of the conductive pads.

In some embodiments, a device comprises stack structures formed on a semiconductor substrate, the stack structures each including insulating layers and gate electrodes alternately and repeatedly stacked on the substrate; vertical channel structures each penetrating a corresponding one of the stack structures; conductive pads each disposed on a corresponding one of the vertical channel structures; pad contacts each overlying and contacting a corresponding one of the conductive pads; and etch stoppers each disposed on a corresponding one of the stack structures and covering sidewalls of the conductive pads on the corresponding one of the stack structures. Adjacent ones of the etch stoppers may be spaced apart from each other. Each of the etch stoppers may have a non-linear perimeter in plan view In some embodiments, the etch stoppers may be in contacts with the pad contacts.

In some embodiments, the pads contacts and the conductive pads are misaligned with each other.

In some embodiments, some of the vertical channel structures may be arranged in a zigzag form in plan view.

In some embodiments, each of the stoppers may fill a space between inner sidewalls of the conductive pads and has a spacer shape on the outer sidewalls of the conductive pads.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
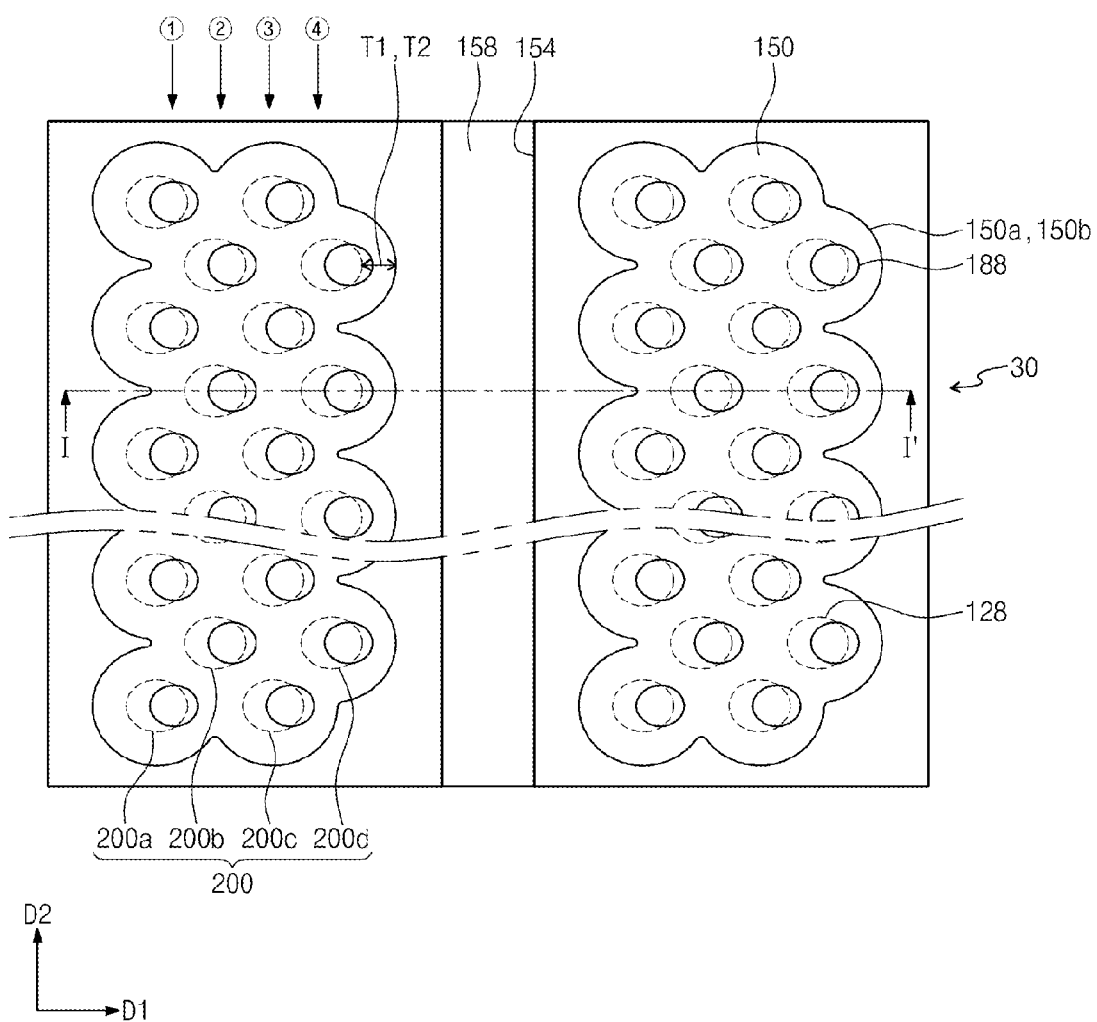
FIG. 1 is a plan view illustrating a semiconductor memory device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle may have rounded or curved features. Thus, the regions illustrated in the figures are schematic in nature and their shapes are not intended to illustrate the actual shape of a region of a device and are not intended to limit the scope of example embodiments.

As appreciated by the inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Now will be described semiconductor memory devices and methods of fabricating the same according to embodiments of the inventive concepts.

Figure 2:
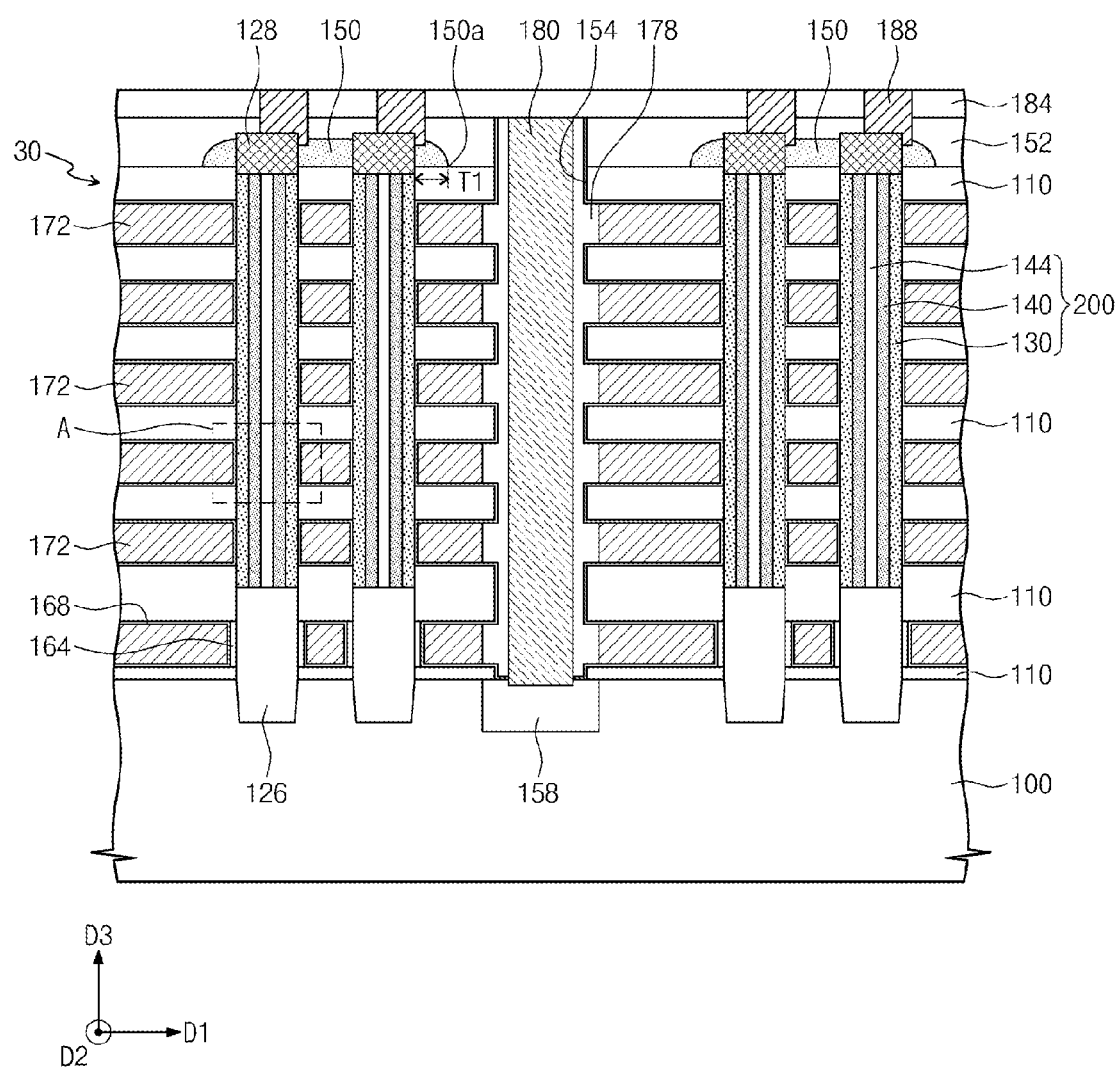
FIG. 2 is a cross-sectional view taken along line I-I' of FIG. 1 to illustrate a semiconductor memory device according to example embodiments of the inventive concepts.
Figure 3:
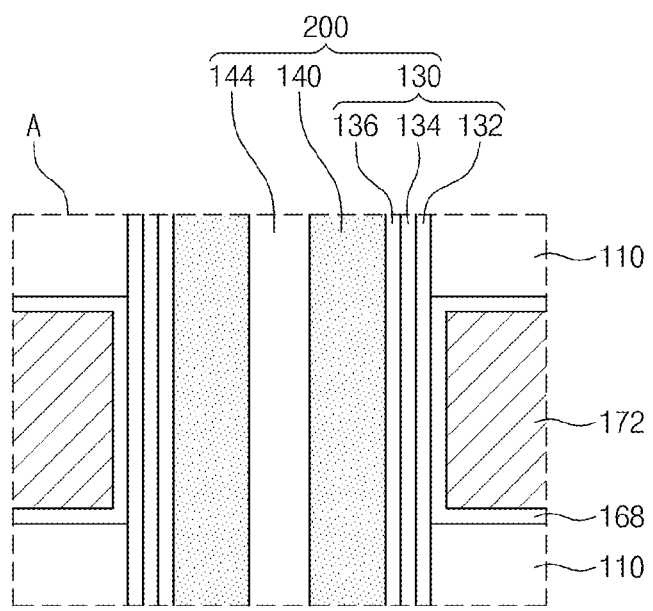
FIG. 3 is an enlarged view of a portion A of FIG. 2.

FIG. 1 is a plan view illustrating a semiconductor memory device according to example embodiments of the inventive concepts. FIG. 2 is a cross-sectional view taken along line I-I' of FIG. 1 to illustrate a semiconductor memory device according to example embodiments of the inventive concepts. FIG. 3 is an enlarged view of a portion A of FIG. 2.

Referring to FIGS. 1 to 3, a semiconductor memory device according to example embodiments of the inventive concepts may include stack structures 30 and vertical channel structures 200 each penetrating a corresponding one of the stack structures 30. Each of the stack structure 30 may include insulating layers 110 and gate electrodes 172 which are alternately and repeatedly stacked on a substrate 100. The vertical channel structures 200 may be spaced apart from each other in a first direction (e.g., a D1-direction) substantially parallel to a top surface of the substrate 100. The vertical channel structures 200 may extend from the substrate 100 in a third direction (e.g., a D3-direction) substantially perpendicular to the top surface of the substrate 100. The substrate 100 may include a semiconductor material. For example, the substrate 100 may be a single-crystalline silicon substrate, a single-crystalline germanium substrate, or a single-crystalline silicon-germanium substrate. Alternatively, the substrate 100 may be a semiconductor-on-insulator (SOI) substrate. For example, the substrate 100 may include a semiconductor layer (e.g., a silicon layer, a silicon-germanium layer, or a germanium layer) that is disposed on an insulating layer protecting transistors provided on a semiconductor substrate. The substrate 100 may be a semiconductor substrate having a first conductivity type (e.g., a P-type).

The stack structure 30 may extend in a second direction (e.g., a D2-direction) crossing the first direction, as illustrated in FIG. 1. For example, the insulating layers 110 and the gate electrodes 172 included in the stack structure 30 may be line-shaped patterns (or rectangular-shaped patterns) extending in the second direction. The first direction and the second direction may be substantially parallel to the top surface of the substrate 100. The insulating layers 110 may be stacked on the substrate 100 in the third direction. Some of the insulating layers 110 may have different thicknesses from some of the insulating layers 110. For example, a thickness of a lowermost insulating layer 110 may thinner than that of other insulating layers 110. A second insulating layer 110 from the substrate 100 may be thicker than other insulating layers 110. The second insulating layer 110 may correspond to a next lowermost one of the insulating layers 110. A thickness of an uppermost insulating layer 110 may be thinner than that of the second insulating layer 110 from the substrate 100. Each of the insulating layers 110 may include an insulating layer such as a silicon oxide layer.

The gate electrodes 172 may be stacked on the substrate 100 in the third direction. Each of the gate electrodes 172 may be disposed between the insulating layers 110. The gate electrodes 172 may include control gate electrodes of memory cells included in the vertical semiconductor memory device (e.g., a vertical NAND flash memory device). For example, the gate electrodes 172 disposed between an uppermost gate electrode 172 and a lowermost gate electrode 172 may be word lines corresponding to the control gate electrodes. Here, the gate electrodes 172 and the vertical channel structures 200 may constitute a plurality of memory cell strings, each of which includes a plurality of the memory cells arranged on the substrate 100 along the third direction.

The lowermost and uppermost gate electrodes 172 may be used as gate electrodes of selection transistors GST and SST. For example, the uppermost gate electrode 172 may be used as a gate electrode of a string selection transistor SST controlling electrical connection between a bit line (not shown) and each of the vertical channel structures 200, and the lowermost gate electrode 172 may be used as a gate electrode of a ground selection transistor GST controlling electrical connection between a common source region 158 formed in the substrate 100 and each of the vertical channel structures 200. The gate electrodes 172 may surround the vertical channel structure 200. Each of the gate electrodes 172 may include a gate conductive layer. The gate conductive layer may include a metal silicide layer, a metal layer, and/or a metal nitride layer. For example, the metal silicide layer may include cobalt silicide, titanium silicide, tungsten silicide, or tantalum silicide. The metal layer may include tungsten, nickel, cobalt, titanium, or tantalum. The metal nitride layer may include titanium nitride, tungsten nitride, or tantalum.

The vertical channel structures 200 may penetrate the stack structure 30 so as to be electrically connected to the substrate 100. Referring to FIG. 1, the vertical channel structures 200 may be arranged along a first column ① and a second column ② substantially parallel to the second direction. First vertical channel structures 200*a* in the first column ① may be spaced apart from second vertical channel structures 200*b* in the second column ② in the first direction. The first and second vertical channel structures 200*a* and 200*b* of the first and second columns ① and ② may be arranged in a zigzag form along the second direction. In addition, the third and fourth vertical channel structures 200*c* and 200*d* of third and fourth columns ③ and ④ may be disposed on a side of the first and second vertical channel structures 200*a* and 200*b* in the first direction. The first and third vertical channel structures 200*a* and 200*c* may be approximately symmetric with respect to the second column ②. The second and fourth vertical channel structures 200b and 200d may be approximately symmetric with respect to the third column ③. A plurality of the vertical channel structures 200 arranged along four columns may constitute a group of the vertical channel structures 200. Thus, groups of the vertical channel structures 200 may be repeatedly arranged in the first direction with the common source region 158 therebetween.

The above embodiment of the inventive concepts is exemplified with the vertical channel structures 200 being arranged along four columns. However, the inventive concepts are not limited thereto. In other embodiments, the vertical channel structures 200 may be arranged along columns of smaller or greater than four.

Each of the vertical channel structures 200 may include a first vertical channel pattern 126, a data storage pattern 130, a second vertical channel pattern 140, and a filling insulation pattern 144. The data storage pattern 130, the second vertical channel pattern 140, and the filling insulation pattern 144 may be disposed on the first vertical channel pattern 126. The first vertical channel pattern 126 may extend into a portion of the substrate 100. A portion of the first vertical channel pattern 126 may be buried in the substrate 100. The vertical channel pattern 126 may protrude upward from the substrate 100 and be a pillar-shaped pattern. The first vertical channel pattern 126 may be disposed in a lower portion of the stack structure 30. For example, a top surface of the first vertical channel pattern 126 may be higher than that of the lowermost gate electrode 172 (e.g., a top surface of the gate electrode of the ground selection transistor) adjacent to the substrate 100. The first vertical channel pattern 126 may be a semiconductor pattern. For example, the first vertical channel pattern 126 may include silicon (Si), germanium (Ge), silicon-germanium (Si—Ge), III-V compound semiconductor material, and/or II-VI compound semiconductor material. For example, the first vertical channel pattern 126 may be an epitaxial layer including single-crystalline silicon. The first vertical channel pattern 126 may include an undoped semiconductor material, or a semiconductor material doped with dopants of which a conductivity type is the same as that of the substrate 100.

A gate insulation layer such as a gate oxide layer 164 may be disposed on a sidewall of the first vertical channel pattern 126. The gate insulation layer 164 may be disposed between the lowermost gate electrode 172 and the first vertical channel pattern 126. The gate insulation layer 164 may include a silicon oxide. The second vertical channel pattern 140 may be disposed on the first vertical channel pattern 126. The second vertical channel pattern 140 may be connected to the first vertical channel pattern 126. The second vertical channel pattern 140 may be disposed between the data storage pattern 130 and the filling insulation pattern 144. The second vertical channel pattern 140 may be shaped like a hollow cylinder with an opened top end or macaroni. In some embodiments, the second vertical channel pattern 140 may have a shape with opened top and bottom ends. In other embodiments, the second vertical channel pattern 140 may have a filled cylinder shape, and in this case, the filling insulation pattern 144 may not be provided in the vertical structure 140. The second vertical channel pattern 140 may have a poly-crystalline semiconductor material, an amorphous semiconductor material, or single-crystalline semiconductor material. For example, the second vertical channel pattern 140 may include silicon (Si), germanium (Ge), silicon-germanium (Si—Ge), III-V compound semiconductor material, or II-VI compound semiconductor material. For example, the second vertical channel pattern 140 may be an epitaxial layer including single-crystalline silicon. For example, the second vertical channel pattern 140 may include an undoped semiconductor material, or a semiconductor material doped with dopants of which a conductivity type is the same as that of the substrate 100.

The data storage pattern 130 may be disposed between the stack structure 30 and the second vertical channel pattern 140. The data storage pattern 130 may have a shape of which top and bottom ends are opened. For example, data stored in the data storage pattern 130 may be changed using the Fowler-Nordheim tunneling effect caused by a voltage difference between the vertical channel structure 200 and the gate electrodes 172. However, the inventive concepts are not limited thereto. Alternatively, the data storage pattern 130 may have a thin layer capable of storing data based on another operation principle (e.g., a thin layer used for a phase change memory device or a thin layer used for a variable resistance memory device).

In some other embodiments, the etch stopper 150 may cover a portion of the top surface of the conductive pads 128 while exposing another portion of the top surface of the conductive pads 128 (not illustrated).

Referring to FIG. 3, the data storage pattern 130 may include a first blocking dielectric layer 132 adjacent to the gate electrodes 172, a tunnel dielectric layer 136 adjacent to the second vertical channel pattern 140, and a charge storage layer 134 disposed between the first blocking dielectric layer 132 and the tunnel dielectric layer 136. The tunnel dielectric layer 136 may include, for example, silicon oxide. The charge storage layer 134 may include a trap insulating layer, or an insulating layer including conductive nano dots. The trap insulating layer may include, for example, silicon nitride. The first blocking dielectric layer 132 may include a silicon oxide layer and/or a high-k dielectric layer (e.g., an aluminum oxide layer or a hafnium oxide layer). The first blocking dielectric layer 132 may be a single layer or a multi-layer structure including a plurality of thin layers. In some embodiments, the first blocking dielectric layer 132 may be a single layer having a silicon oxide layer. In other embodiments, the first blocking dielectric layer 132 may include a plurality of thin layers including at least two of a silicon oxide layer, an aluminum oxide layer, and/or a hafnium oxide layer.

A second blocking dielectric layer 168 may be additionally provided between the stack structure 30 and the vertical channel pattern structures 200 and extends between the insulating layers 110 and the gate electrodes 172. For example, the second blocking dielectric layer 168 may extend in a direction substantially horizontal to the substrate 100, thereby covering top surfaces and bottom surfaces of the gate electrodes 172. For example, the second blocking dielectric layer 168 may be a single layer or a multi-layer structure including a plurality of thin layers. For example, the second blocking dielectric layer 168 may include a high-k dielectric layer (e.g., an aluminum oxide layer and/or a hafnium oxide layer). In some embodiments, the second blocking dielectric layer 168 may not be formed.

The filling insulation pattern 144 may be disposed in an inner region of the vertical channel structure 200. The filling insulation pattern 144 may include a silicon oxide layer or a silicon nitride layer.

Each of the conductive pads 128 may be disposed on a corresponding one of the vertical channel structures 200. When viewed in plan view, the conductive pads 128 may be two-dimensionally arranged like the vertical channel structures 200 illustrated in FIG. 1. Each of the conductive pads 128 may include a conductive material. For example, each of the conductive pads may include poly-crystalline silicon, or amorphous silicon. Alternatively, each of the conductive pads 128 may be a region doped with dopants. The top ends, which are in contact with the conductive pads 128, of the vertical channel structures 200 may be drain regions. A portion of each of the conductive pads 128 may protrude upward from the uppermost insulation layer 110.

An etch stopper 150 may be disposed on sidewalls of the conductive pads 128. The etch stopper 150 may be disposed having a spacer shape on the sidewalls of the conductive pads 128. For example, the etch stopper 150 may fill a space between the inner sidewalls of the conductive pads 128 and may have a spacer shape on the outer sidewalls of the conductive pads 128. When viewed in plan view, the etch stopper 150 may be an isolated pattern disposed on the stack structure 30. The etch stopper 150 may be an insulation pattern laterally or horizontally spaced apart from a trench 154. The etch stopper 150 may extend in a second direction. When viewed in plan view, the etch stopper 150 may have a non-linear perimeter such as a wavy perimeter 150a and cover the sidewalls of the conductive pads 128 in the first and second directions. In other words, the etch stopper 150 may have a perimeter or boundary with a wavy form. The etch stopper 150 may have the perimeter 150a laterally spaced apart from the outer sidewalls of the conductive pads 128 by a first distance T1. The etch stopper 150 may cover at least a portion of the sidewalls of each of the conductive pads 128. Accordingly, the etch stopper 150 may expose a portion of each of the conductive pads 128. The etch stopper 150 may include a material having an etch selectivity with respect to the uppermost insulating layer 110. The etch stopper 150 may include silicon nitride.

A capping insulation layer 152 may be disposed on the stack structure 30 to cover the conductive pads 128 and the etch stopper 150. The capping insulation layer 152 may include a silicon oxide layer.

A trench 154 may be provided between the stack structures 30 to isolate adjacent stack structures 30. Alternatively, the trench 154 may isolate adjacent groups of the vertical channel structures 200 in the first direction. Each group of the vertical channel structures 200 may include the vertical channel structures 200 arranged along four columns in the second direction. However, the inventive concepts are not limited thereto. In other embodiments, each group of the vertical channel structures 200 may be arranged along columns of which the number is smaller or greater than four. The trench 154 may extend in the second direction. The trench 154 may extend from the capping insulation layer 152 to the substrate 100 in the third direction.

The common source region 158 may be disposed in the substrate 100 between the stack structures 30. For example, the common source region 158 may formed in the substrate 100 exposed through the trench 154 and extend in the second direction. The common source region 158 may include a conductive dopant region. The common source region 158 may include dopants of which a second conductivity type is different from the first conductivity type of the substrate 100. For example, the common source region 154 may be doped with N-type dopants such as phosphorus (P) or arsenic (As). A common source plug 180 may be disposed on the common source region 158. The common source plug 180 may be disposed in the trench 150 so as to be electrically connected to the common source region 158. The common source plug 180 may reduce the resistance of the common source region 158. The common source plug 180 may have an island shape. In this case, a plurality of common source plugs 180 may be arranged in the second direction. Alternatively, the common source plug 180 may have a line shape extending in the second direction. The common source plug 180 may include a conductive material. For example, the common source plug 180 may include polysilicon, or metal such as tungsten or copper.

An isolation insulating layer 178 may be disposed between the stack structure 30 and the common source plug 180. For example, the isolation insulating layer 178 may be disposed between the common source plug 180 and the gate electrodes 172. The isolation insulating layer 180 may fill spaces between the insulating layers 110 to protect sidewalls of the gate electrodes 172. The isolation insulating layer 180 may include, for example, silicon oxide.

An upper interlayer insulating layer 184 may be disposed on the capping insulation layer 152. The upper interlayer insulating layer 184 may cover the common source plug 180. The upper interlayer insulating layer 184 may include, for example, silicon oxide.

Pad contacts 188 penetrating the upper interlayer insulating layer 184 and the capping insulation layer 152 may be connected to the conductive pads 128. Each of the pad contacts 188 may be contact with a corresponding one of the conductive pads 128 in a misaligned configuration. For example, a misalignment between the pad contacts 188 and the conductive pads 128 may be occurred due to physical variations of the vertical channel structures 200 (e. g., the vertical channel structures 200 being lopsided). Thus, a portion of each of the pad contacts 188 may overlap with a portion of a corresponding one of the conductive pads 128. In other words, each of the pad contacts 188 may be contact with a portion of the top surface and a portion of the sidewall of each of the conductive pads 128 and the etch stopper 150. The pad contacts 188 may be connected to a bit line (not shown) on the upper interlayer insulating layer 184. The pad contacts 188 may include a conductive material such as metal, metal nitride, or doped polysilicon.

According to the example embodiments of the inventive concepts, the semiconductor memory device may include the etch stopper 150 on the sidewalls of the conductive pads 128. Even if the pad contacts 188 and the conductive pads 128 may be contact each other in misaligned configurations, the etch stopper 150 may prevent the pad contacts 188 from penetrating the uppermost insulating layer 110. As a result, shorts or bridges may be prevented from occurring between the pad contacts 188 and the uppermost gate electrode 172.

Figure 4:
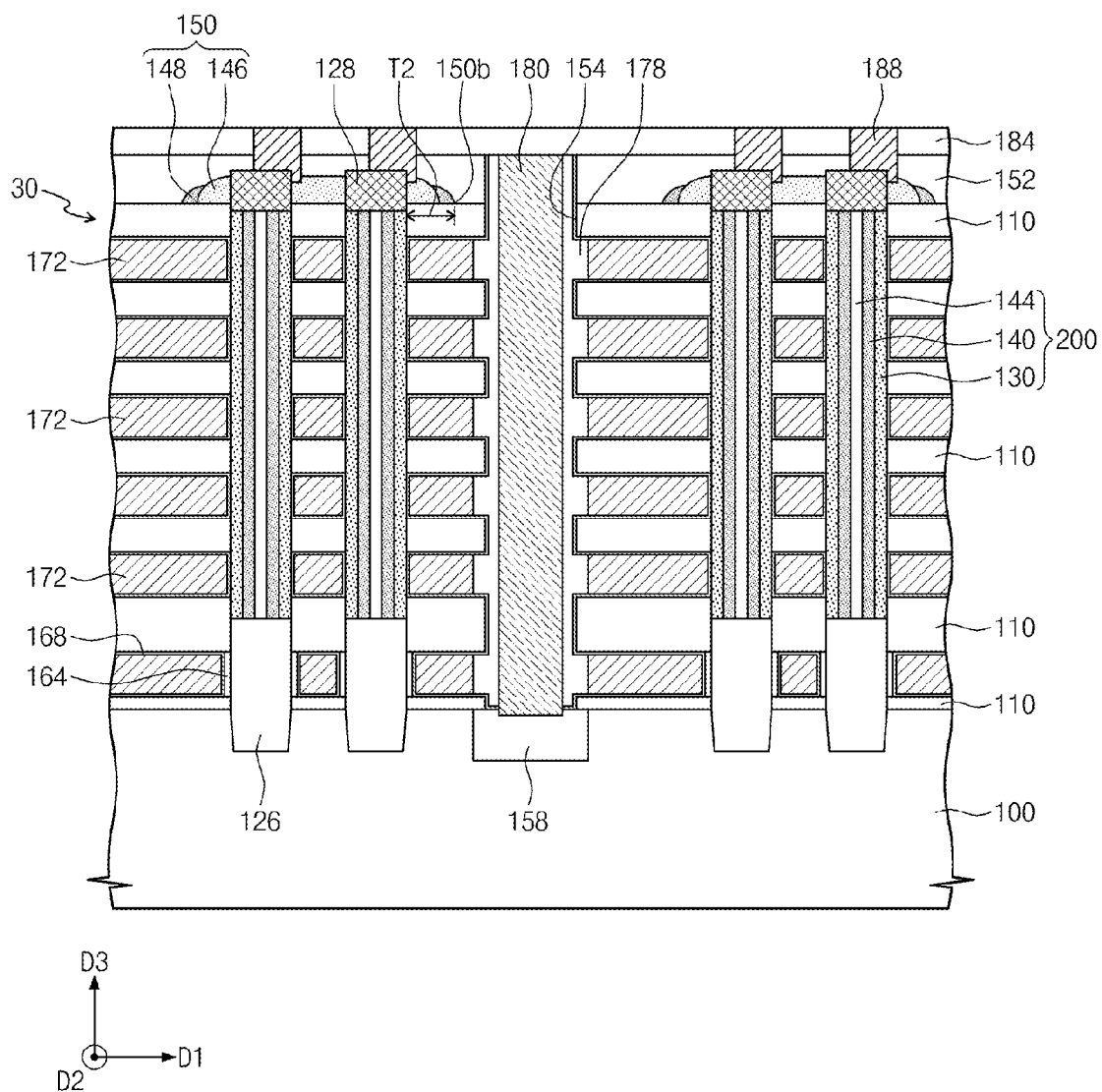
FIG. 4 is a cross-sectional view taken along line I-I' to illustrate a semiconductor memory device according to example embodiments of the inventive concepts.

FIG. 4 is a cross-sectional view taken along line I-I' to illustrate the semiconductor memory device according to example embodiments of the inventive concepts.

Referring to FIG. 4, the semiconductor memory device according to example embodiments of the inventive concepts may include the etch stopper 150. The etch stopper 150 may include a first etch stopper pattern 146 and a second etch stopper pattern 148. For example, the etch stopper 150 may include double spacers. For example, the first etch stopper pattern 146 may fill the space between the inner sidewalls of the conductive pads 128 and be disposed having a spacer shape on the outer sidewalls of the conductive pads 128. The second etch stopper pattern 148 may be disposed having a spacer shape on the sidewalls of the first etch stopper pattern 146. The etch stopper 150 may be spaced apart from the trench 154 by a predetermined distance.

The etch stopper 150 may include a perimeter 150b horizontally spaced apart from the outer sidewalls of the conductive pads 128 by a second distance T2. The second distance T2 may be greater than the first distance T1 shown in FIG. 2. For example, the second distance T2 may be greater than the first distance T1 by a width of the second etch stopper pattern 148 in the first direction. As a result, even if the misalignment between the conductive pads 128 and the pad contacts 188 are severe, the uppermost insulating layer 110 may be sufficiently protected by the etch stopper 150. In some embodiments, the etch stopper 150 may include two or more etch stopper patterns. For example, the etch stopper 150 may include a plurality of etch stopper patterns disposed on the sidewalls of the second etch stopper pattern 148. In other words, the etch stopper 150 may include a plurality of spacers disposed on the outer sidewalls of the conductive pads 128.

Figure 5:
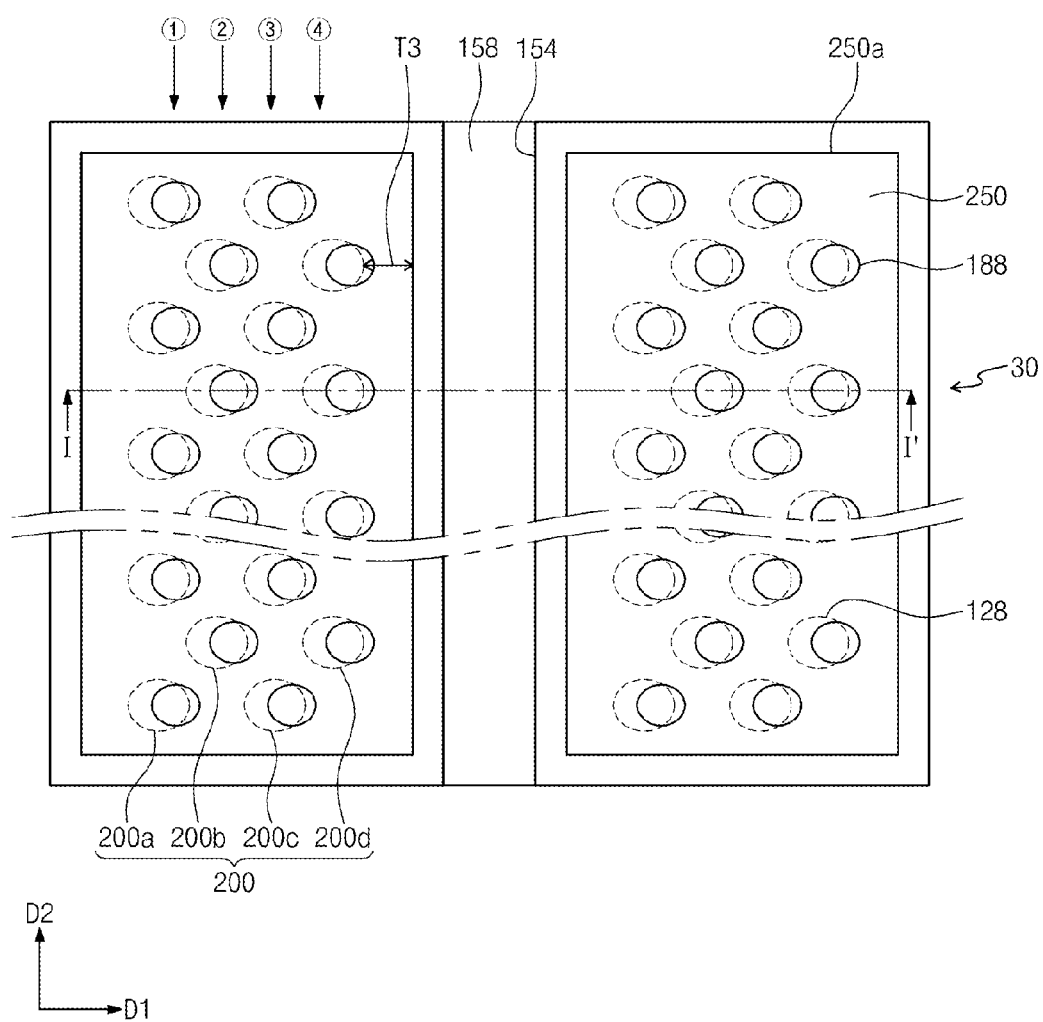
FIG. 5 is a plan view illustrating a semiconductor memory device according to example embodiments of the inventive concepts.
Figure 6:
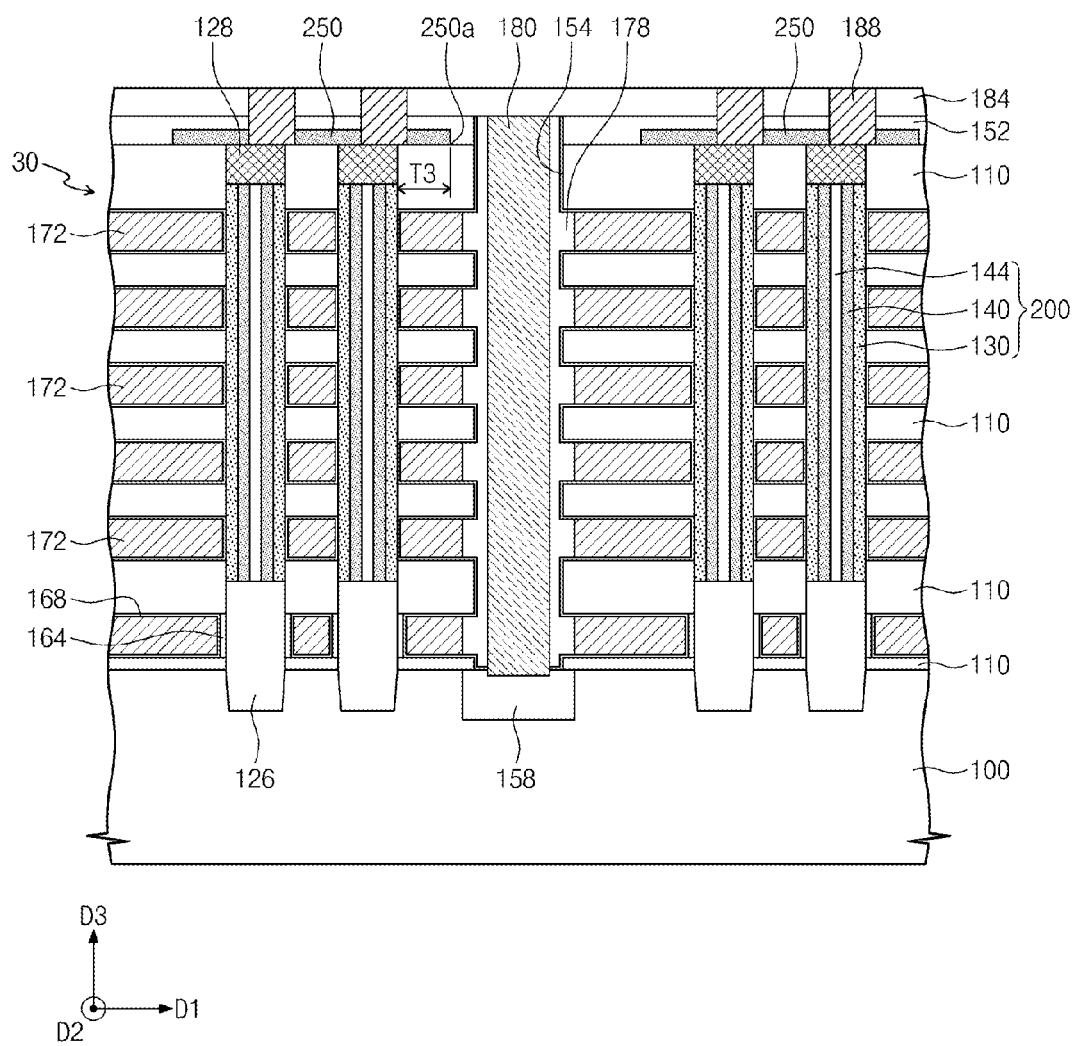
FIG. 6 is a cross-sectional view taken along line II-II' to illustrate a semiconductor memory device according to example embodiments of the inventive concepts.

FIG. 5 is a plan view to illustrate the semiconductor memory device according to example embodiments of the inventive concepts, and FIG. 6 is a cross-sectional view taken along line II-II' of FIG. 5 to illustrate a semiconductor memory device according to example embodiments of the inventive concepts. Hereinafter, the descriptions to the same elements as in the embodiments illustrated in FIGS. 1 to 3 will be omitted or mentioned briefly for the sake of brevity. In other words, differences between the present embodiment and the embodiment of FIGS. 1 to 4 will be mainly described.

Referring to FIGS. 5 and 6, the semiconductor memory device according to example embodiments of the inventive concepts may include a etch stopper 250. The etch stopper 250 may be disposed on the uppermost insulating layer 110 of the stack structure 30 to cover the conductive pads 128. The etch stopper 150 may be spaced apart from the trench 154 by a predetermined distance. When viewed in plan view, etch stopper 250 may be a line-shaped pattern. For example, the etch stopper 250 may have a linear perimeter 250a. The perimeter 250a of the etch stopper 250 may be spaced apart from the outer sidewalls of the conductive pads 128 by at least a third distance T3. For example, the etch stopper 250 may be a pattern with the perimeter 250 horizontally spaced apart from the outer sidewalls of the conductive pads 128 on the vertical channel structures 200 arranged along the first and fourth columns 200a and 200d, as shown FIG. 5. The third distance T3 may be approximately the same as any one of the first and second distances T1 and T2 shown in FIGS. 2 and 4, or may be greater than any one of the first and third distances T1 and T2.

An uppermost insulating layer 110 of FIG. 6 may be thicker than the uppermost insulating layer 110 of FIG. 2. The uppermost insulating layer 110 may cover the sidewalls of the conductive pads 128 and expose the top surfaces of the conductive pads 128. A capping insulation layer 152 may disposed on the stack structures 30 so as to cover the etch stopper 128. An upper interlayer insulating layer 184 may be disposed on the capping insulation layer 152.

Pad contacts 188 may penetrate the upper interlayer insulating layer 184 and the capping insulation layer 152 to be in contact with the conductive pads 128. Even if the pad contacts 188 are in contact with the conductive pads 128 in a misaligned configuration, the uppermost insulating layer 110 may be sufficiently protected by the etch stopper 150, thereby substantially preventing the pad contacts 188 from penetrating the uppermost layer 110 to be connected to the uppermost gate electrode 172.

FIGS. 7, 8, 9, 11, 12, 13, 14, 15, 16, 17, and 18 are cross-sectional views taken along line I-I' of FIG. 1 to illustrate a method of fabricating a semiconductor memory device according to example embodiment of the inventive concepts illustrated in FIGS. 1 to 3. FIG. 10 is an enlarged view of a portion B of FIG. 9.

Figure 7:
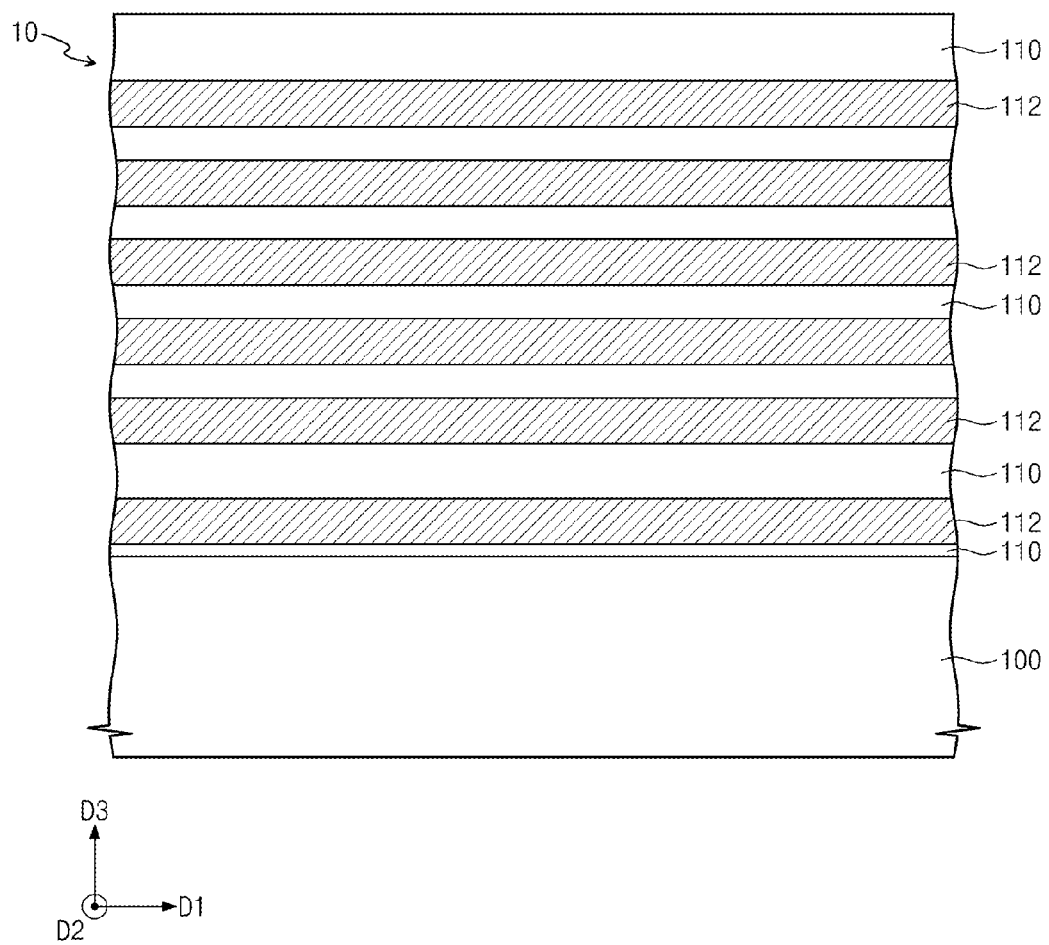
FIGS. 7 to 9 and 11 to 18 are cross-sectional views taken along line I-I' of FIG. 1 to illustrate a method of fabricating a semiconductor memory device according to example embodiments of the inventive concepts.

Referring to FIG. 7, a molding structure 10 may be formed on a substrate 100. For example, insulating layers 110 and sacrificial layers 112 may be alternately and repeatedly stacked on the substrate 100 to form the molding structure 10. The insulating layers 100 and sacrificial layers 112 each may have a multilayer structure, instead of a single-layer structure.

The substrate 100 may include a semiconductor material. For example, the substrate 100 may be a single-crystalline silicon substrate, a single-crystalline germanium substrate, or a single-crystalline silicon-germanium substrate. Alternatively, the substrate 100 may be a semiconductor-on-insulator (SOI) substrate. For example, the substrate 100 may include a semiconductor layer (e.g., a silicon layer, a silicon-germanium layer, or a germanium layer) that is disposed on an insulating layer of protecting transistors provided on a semiconductor substrate. The substrate 100 may be a semiconductor substrate having a first conductivity type (e.g., a P-type).

The sacrificial layers 112 may be formed of a material that has an etch selectivity with respect to the insulating layers 110. For example, an etch rate of the sacrificial layers 112 may be higher than that of the insulating layers 110 during a wet etching process using a chemical solution. In some embodiments, each of the insulating layers 110 may be a silicon oxide layer or a silicon nitride layer, and each of the sacrificial layers 112 may be formed of a material selected from the group consisting of silicon oxide, silicon nitride, silicon carbide, silicon, and silicon-germanium and has an etch selectivity with respect to the insulating layers 110. For example, the insulating layers 110 may be silicon oxide layers, and the sacrificial layers 112 may be silicon nitride layers.

Each of the insulating layers 110 and the sacrificial layers 112 may be formed using a thermal chemical vapor deposition (thermal CVD) process, a plasma enhanced CVD process, or an atomic layer deposition (ALD) process.

Thicknesses of the sacrificial layers 112 may be substantially equal to each other. In some embodiments, a lowermost insulating layer 110 being in contact with the substrate 100 may be a silicon oxide layer formed by a thermal oxidation process or a deposition process. The lowermost insulating layer 110 may be thinner than other insulating layers 110 formed above the lowermost insulating layer 110. Another insulating layer 110 stacked overlying the lowermost insulating layer 110 and an uppermost insulating layer 110, and an insulating layer 110 immediately below the uppermost insulating layer 110 may be thicker than other insulating layers 110 and the sacrificial layers 112.

Figure 8:
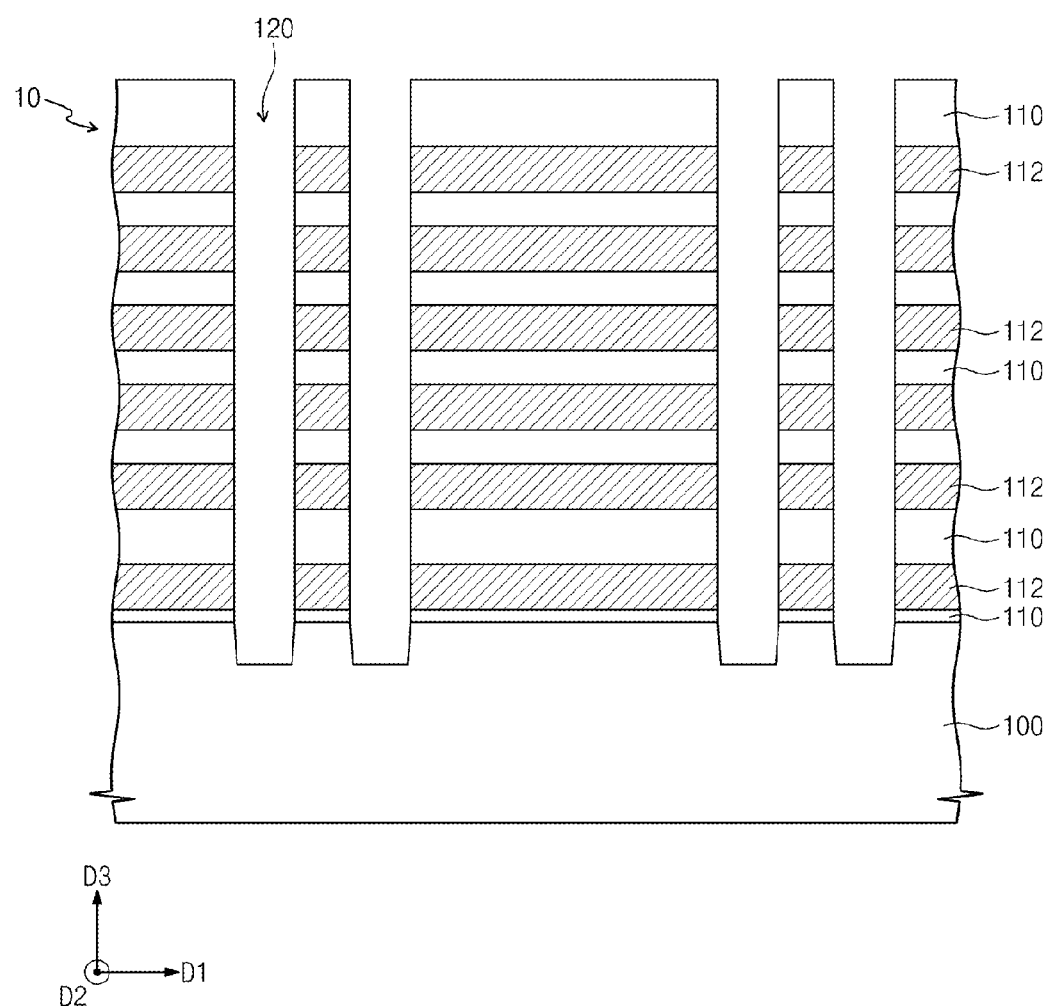

Referring to FIG. 8, channel holes 120 may be formed to penetrate the molding structure 10. The channel holes 120 may expose a region of an upper surface of the substrate 100. The channel holes 120 may be formed by anisotropically etching the molding structure 10. The channel holes 120 may be two-dimensionally arranged like the vertical channel structure 200 illustrated in FIG. 1. For example, each group of the channel holes 120 may include a plurality of the channel holes 120 that are arranged along four columns in the second direction. The groups of the channel holes 120 may be spaced apart from each other in the first direction. The above embodiment is exemplified with the channel holes 120 being arranged along four columns. However, the inventive concepts are not limited thereto. For example, the channel holes 120 may be arranged along columns of which the number is smaller than four (e.g., two) or greater than four (e.g., six). The substrate 100 may be recessed by over-etching during the formation of the channel holes 120.

Figure 9:
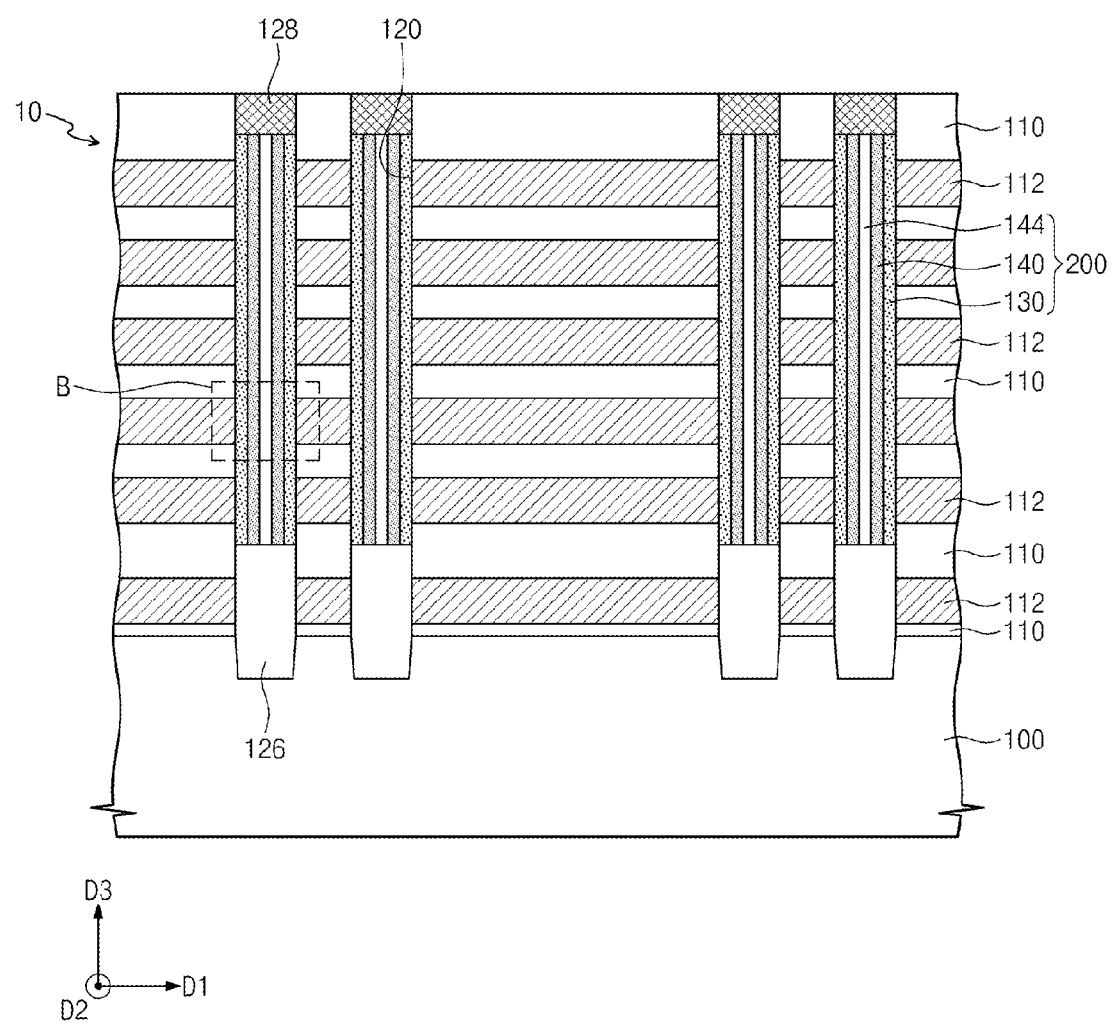
Figure 10:
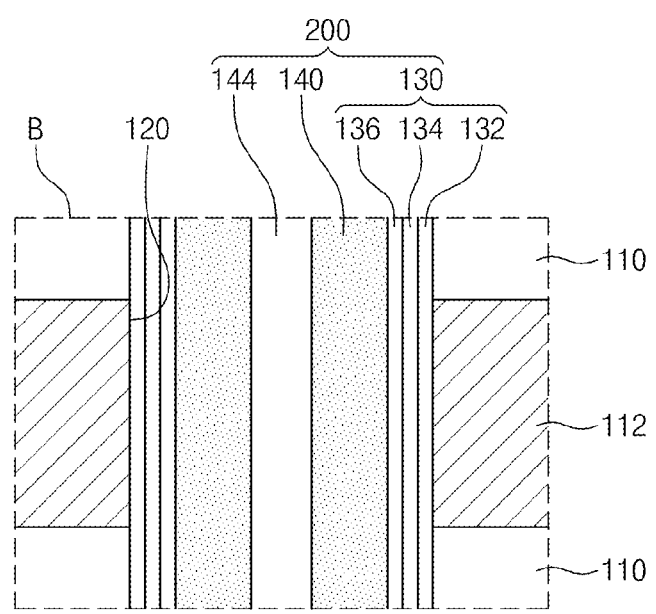
FIG. 10 is an enlarged view of a portion A of FIG. 9.

Referring to FIGS. 9 and 10, vertical channel structures 200 may be formed on the substrate 100. The vertical channel structures 200 may penetrate the molding structure 10 and may extend in the third direction. The vertical channel structures 200 may fill the channel holes 120, respectively, and may extend into a portion of the substrate 100. Each of the vertical channel structures 200 may include a first vertical channel pattern 126, a data storage pattern 130, a second vertical channel pattern 140, and a filling insulation pattern 144. The first vertical channel pattern 126 may be a pillar-shaped pattern that fills the recessed region in the substrate 100 and protrude upward from the substrate 100. The first vertical channel pattern 126 may fill a lower portion of each of the channel holes 120. For example, the first vertical channel pattern 126 may protrude upward from the substrate 100 so as to be in contact with sidewalls of the lowermost insulating layer 110 and a lowermost sacrificial layer 112 and so as to cover a portion of a sidewall of the second insulating layer 110 from the substrate 100. For example, a top surface of the first vertical channel pattern 126 may be lower than a top surface of the second insulating layer 110 from the substrate 100. The first vertical channel pattern 126 may be a semiconductor pattern. For example, the first vertical channel pattern 126 may include silicon (Si), germanium (Ge), silicon-germanium (Si—Ge), III-V semiconductor material, or II-VI semiconductor material. For example, the first vertical channel pattern 126 may include a semiconductor material that is formed by a selectively epitaxial growth (SEG) process. The first vertical channel pattern 126 may include dopants of which conductivity type is the same as that of the substrate 100. In some embodiments, the first vertical channel pattern 126 may be in-situ doped with dopants during the SEG process. Alternatively, the first vertical channel pattern 126 may be doped with dopants by an ion implantation process. Next, the data storage pattern 130, the second vertical channel pattern 140, and the filling insulation pattern 144 may be formed on the first vertical channel pattern 126 in each of the channel holes 120 penetrating the molding structure 10.

The data storage pattern 130 may cover an inner sidewall of each of the channel holes 120. The data storage pattern 130 may be a spacer-shaped pattern formed on the inner sidewall of each of the channel hole 120. In some embodiments, the data storage pattern 130 may have a shape with opened top and bottom ends. The data storage pattern 130 may be in contact with the insulating layers 110 and the sacrificial layers 112 of the molding structure 110. For example, the data storage pattern 130 may include a thin layer capable of storing data using the Fowler-Nordheim tunneling effect. However, the inventive concepts are not limited thereto. In other embodiments, the data storage pattern 130 may include a thin layer capable of storing data based on another operation principle (e.g., a thin layer used for a phase change memory device or a thin layer used for a variable resistance memory device). The data storage pattern 130 may be formed of a plurality of thin layers. In some embodiments, the data storage pattern 130 may include a first blocking dielectric layer 132, a charge storage layer 134, and a tunnel dielectric layer 136, as illustrated in FIG. 10. For example, the first blocking dielectric layer 132, the charge storage layer 134, and the tunnel dielectric layer 136 may be sequentially stacked on the inner sidewall of the channel hole 120. The first blocking dielectric layer 132 may include a silicon oxide layer and/or a high-k dielectric layer (e.g., an aluminum oxide layer or a hafnium oxide layer). The first blocking dielectric layer 132 may be a single-layer or a multi-layer structure including a plurality of thin layers.

In some embodiments, the first blocking dielectric layer 132 may be a single layer comprising silicon oxide. In other embodiments, the first blocking dielectric layer 132 may include a plurality of thin layers including at least two of a silicon oxide layer, an aluminum oxide layer, and/or a hafnium oxide layer.

The charge storage layer 134 may include a trap insulating layer, or an insulating layer including conductive nano dots. For example, the trap insulating layer may include a silicon nitride layer. The tunnel dielectric layer 136 may include, for example, silicon oxide. Each of the first blocking dielectric layer 132 and the charge storage layer 134 may be formed using a plasma enhanced CVD process or an ALD process. The tunnel dielectric layer 136 may be formed using a plasma enhanced CVD process, an ALD process, or a thermal oxidation process. The tunnel dielectric layer 136 may be in contact with the second vertical channel pattern 140.

The second vertical channel pattern 140 may be connected to the first vertical channel pattern 126 and may be in contact with the data storage pattern 130. The second vertical channel pattern 140 may be a liner-shaped pattern formed in the channel hole 120. The second vertical channel pattern 140 may be conformally formed in the channel hole 120. The second vertical channel pattern 140 may have a hollow macaroni shape with an opened top end. In some embodiments, the second vertical channel pattern 140 may have a shape with opened top and bottom ends. In other embodiments, the second vertical channel pattern 140 may be a cylinder-shaped pattern that fills the channel hole 120 without the filling insulation pattern 144. The second vertical channel pattern 140 may include a semiconductor material. For example, the second vertical channel pattern 140 may include any one of a poly-crystalline semiconductor material, an amorphous semiconductor material, or a single-crystalline semiconductor material. For example, the second vertical channel pattern 140 may include silicon (Si), germanium (Ge), III-V semiconductor material, and/or II-VI semiconductor material. The second vertical channel pattern 140 may include an undoped semiconductor material, or a semiconductor material doped with dopants that have the same conductivity type as that of the substrate 100. The second vertical channel pattern 140 may be formed using an ALD process or a CVD process.

The filling insulation pattern 144 may fill the channel hole 120 in which the second vertical channel pattern 140 is formed. The filling insulation pattern 144 may include a silicon oxide layer or a silicon nitride layer. Before the filling insulation pattern 144 is formed, a hydrogen annealing process may be further performed to cure crystal defects that may exist in the second vertical channel pattern 140.

Each of conductive pads 128 may be formed on each of the vertical channel structures 200. In some embodiments, upper portions of the vertical channel structures 200 may be etched to form recessed regions, and each of the recessed regions may be filled with a conductive material to form each of the conductive pads 128. Each of the conductive pads 128 may include poly-crystalline silicon, or amorphous silicon. In other embodiments, each of the conductive pads 128 may be formed by injecting dopants in the top end portion of the second vertical channel pattern 140. A drain region may be formed in the second vertical channel patterns 140 under the conductive pad 128.

Figure 11:
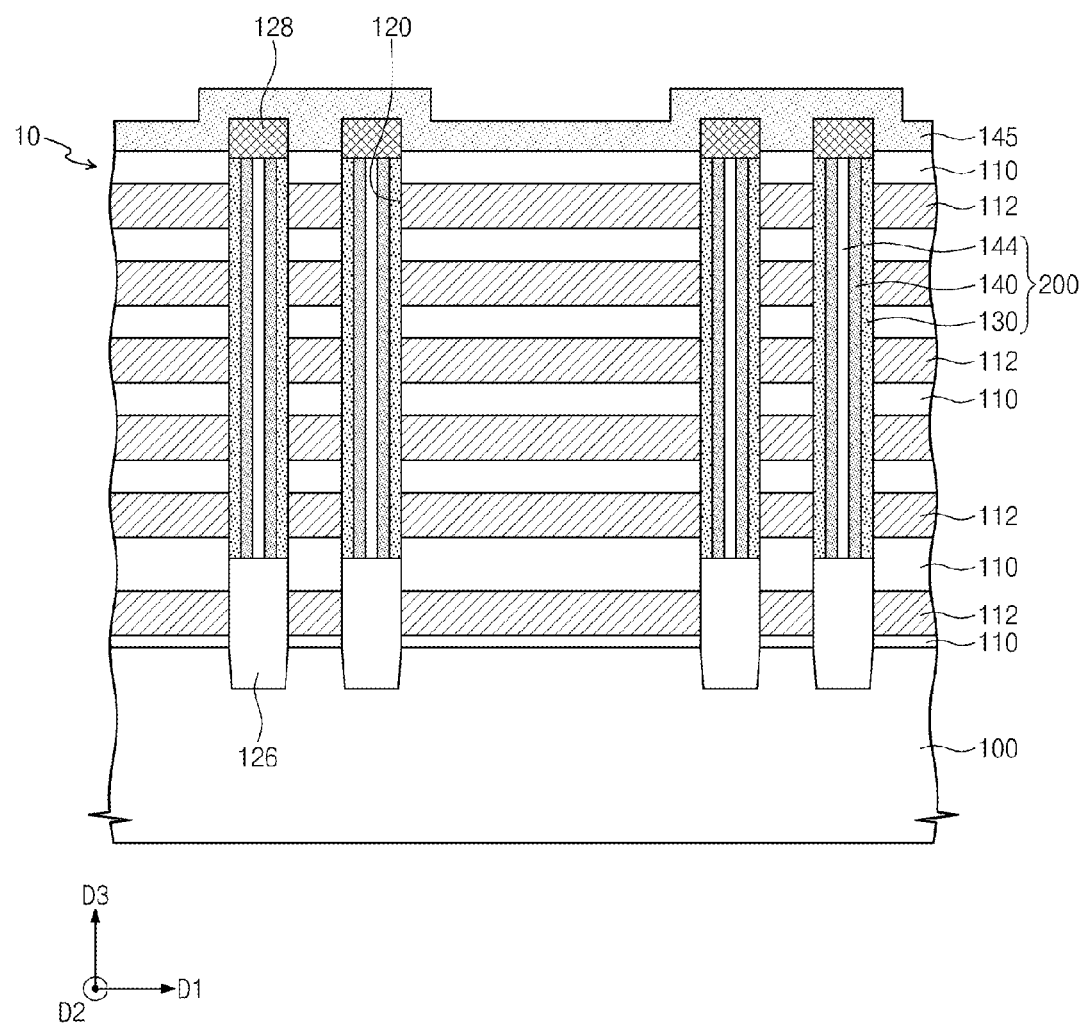

Referring to FIG. 11, an upper portion of the uppermost insulating layer 110 of the molding structure 10 may be removed. Thus, a portion of each of the conductive pads 128 may protrude upward from the uppermost insulating layer 110. For example, sidewalls of the conductive pads 128 may be exposed by performing an etch-back process on the uppermost insulating layer 110.

An etch stopper layer 145 may formed on the uppermost insulating layer 110 to cover the conductive pads 128. For example, the etch stopper layer 145 may be formed to have an enough thickness to fill the space or void between the conductive pads 128. The thickness of the etch stopper layer 145 and the height of the portion of the conductive pads 128 protruding from the uppermost insulating layer 110 may be determined by the thickness and the size of an etch stopper 150 to be formed in the next step. The etch stopper layer 145 may formed of a material having an etch selectivity with respect to the uppermost insulating layer 110. The etch stopper layer 145 may include, for example, silicon nitride.

Figure 12:
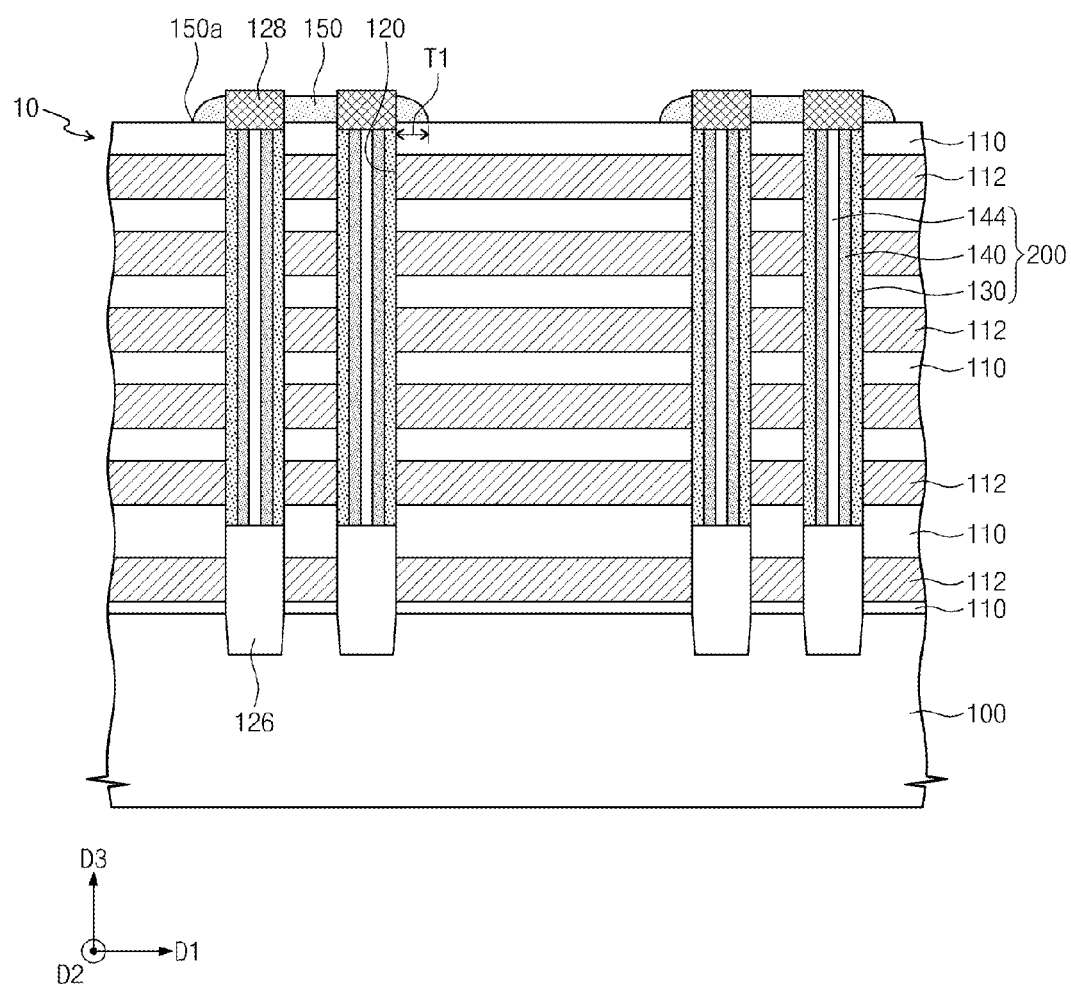

Referring to FIG. 12, an etch stopper 150 may be formed on the molding structure 10 to cover sidewalls of the conductive pads 128 by etching back the etch stopper layer 145. The etch stopper 150 may have a spacer shape. For example, the etch stopper layer 150 may be etched back to expose top surfaces of the conductive pads 128. At this time, a portion of sidewalls of the conductive pads 128 may be exposed. The etch stopper 150 may fill the space between inner sidewalls of the conductive pads 128 and may formed to have a spacer shape on outer sidewalls of the conductive pads 128. The etch stopper 150 may have a perimeter 150a laterally spaced apart from the outer sidewalls of the conductive pads 128 by at least a first distance T1. When viewed in plan view, the etch stopper 150 may have a non-linear perimeter such as a wavy perimeter 150a and cover the sidewalls of the conductive pads 128, as illustrated in FIG. 1.

Figure 13:
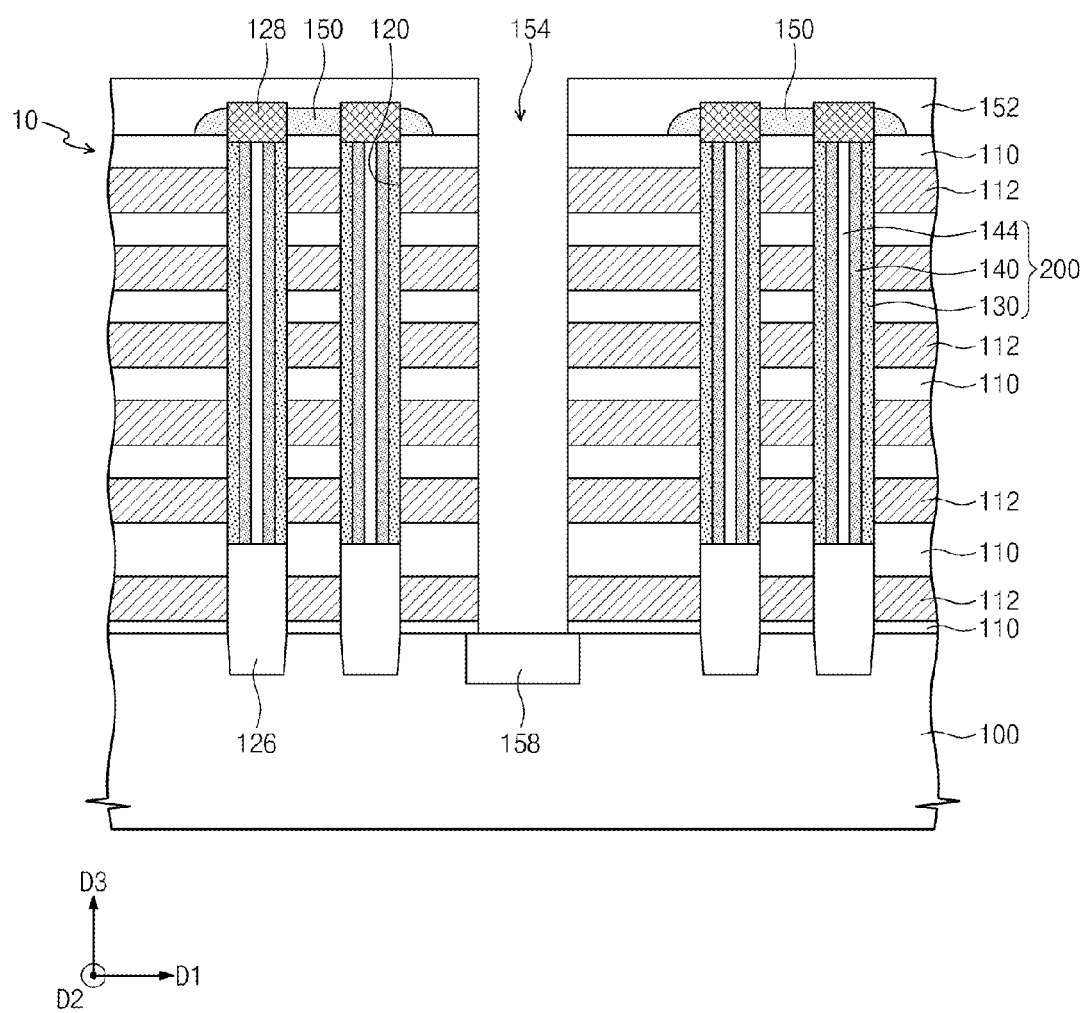

Referring to FIG. 13, a capping insulation layer 152 may formed on the uppermost insulating layer 110 to cover the etch stopper 150 and the conductive pads 128. The capping insulation layer 152 may include, for example, silicon oxide.

The capping insulation layer 152 and the molding structure 10 may be patterned to form a trench 154 exposing a region of the substrate 100 between the vertical channel structures 200, and a common source region 158 may be formed in the substrate 100 exposed through the trench 154. The trench 154 may be formed by anisotropically etching the capping insulation layer 152 and the molding structure 10. In some embodiments, the trench 154 may isolate adjacent groups of the vertical channel structures 200 in the first direction. Each of groups of the vertical channel structures 200 may include a plurality of the vertical channel structures 200 arranged along four columns in the second direction. In other embodiments, each group of the vertical channel structures 200 may include a plurality of the vertical channel structures 200 along columns of smaller or greater than four. The trench 154 may be horizontally spaced apart from the etch stopper 150 by a predetermined distance. Accordingly, the etch stopper 150 may not be exposed by the trench 154. The common source region 158 may be formed by injecting N-type dopant ions such as phosphorus ions, or arsenic ions in the substrate 100 through the trench 154.

Figure 14:
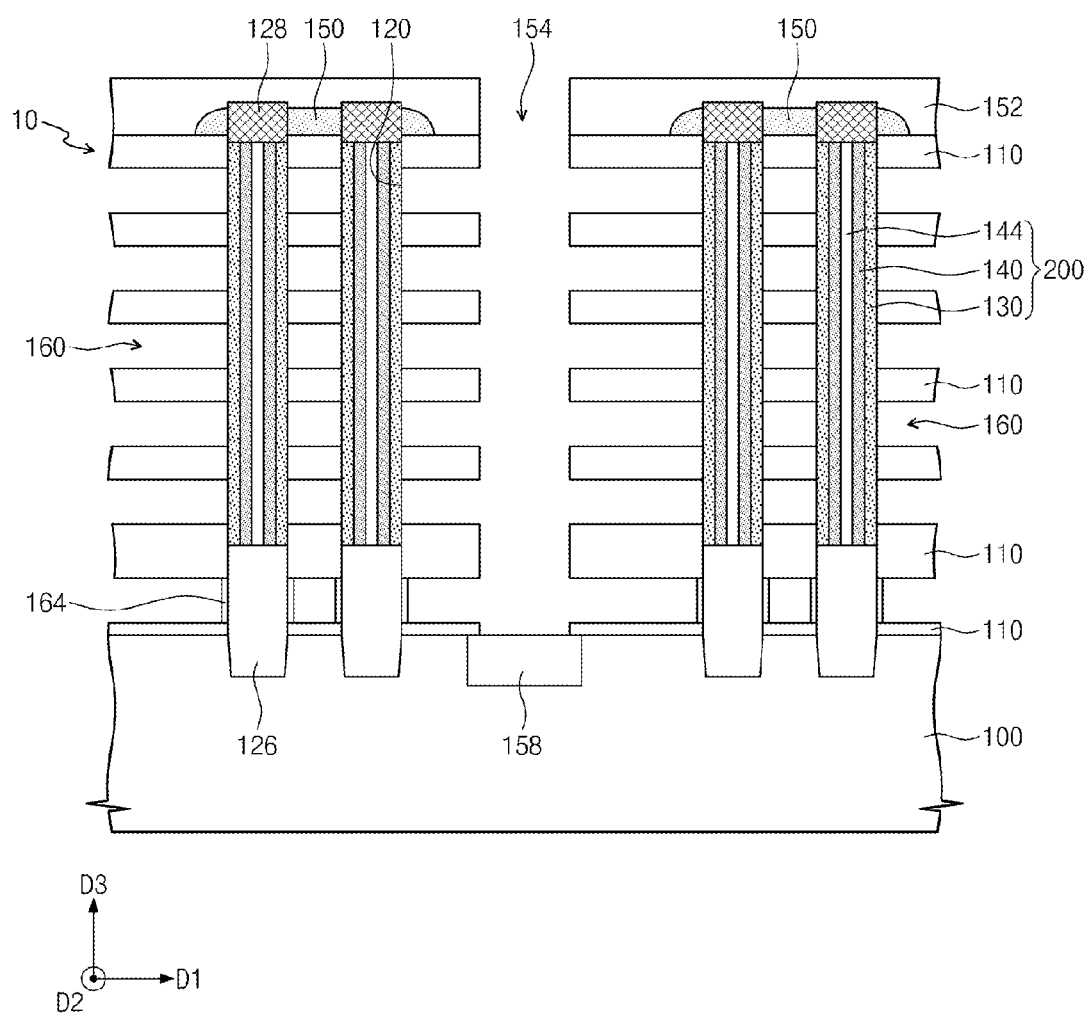

Referring to FIG. 14, opening regions 160 may be formed in the molding structure 10. The sacrificial layers 112 exposed by the trench 150 may be removed to form the opening regions 160 between the insulating layers 110. For example, if the sacrificial layers 112 are silicon nitride layers and the insulating layers 110 are silicon oxide layers, the sacrificial layers 112 may be isotropically etched using an etching solution including phosphoric acid to form the opening regions 160. When the opening regions 160 are formed, the etch stopper 150 unexposed to the trench 154 may not be removed and remain on the molding structure 10. The opening regions 160 may be regions in which gate electrodes are to be formed. The vertical channel structures 200 may be partially exposed by the opening regions 160. For example, the data storage pattern 130 of the vertical channel structure 200 may be exposed by the opening regions 160. For example, the first blocking dielectric layer 132 of FIG. 10 of the data storage pattern 130 may be exposed by the opening regions 160. In addition, a sidewall of the first vertical channel pattern 126 may be exposed by at least a lowermost one of the opening regions 160. The opening regions 160 may extend in the first and second directions. A gate oxide layer 164 may be formed on a sidewall of the first vertical channel pattern 126. For example, the sidewall of the first vertical channel pattern 126 exposed by the opening regions 160 may be oxidized to form the gate oxide layer 164. The gate oxide layer 164 may be used as a gate oxide layer of a ground selection transistor.

Figure 15:
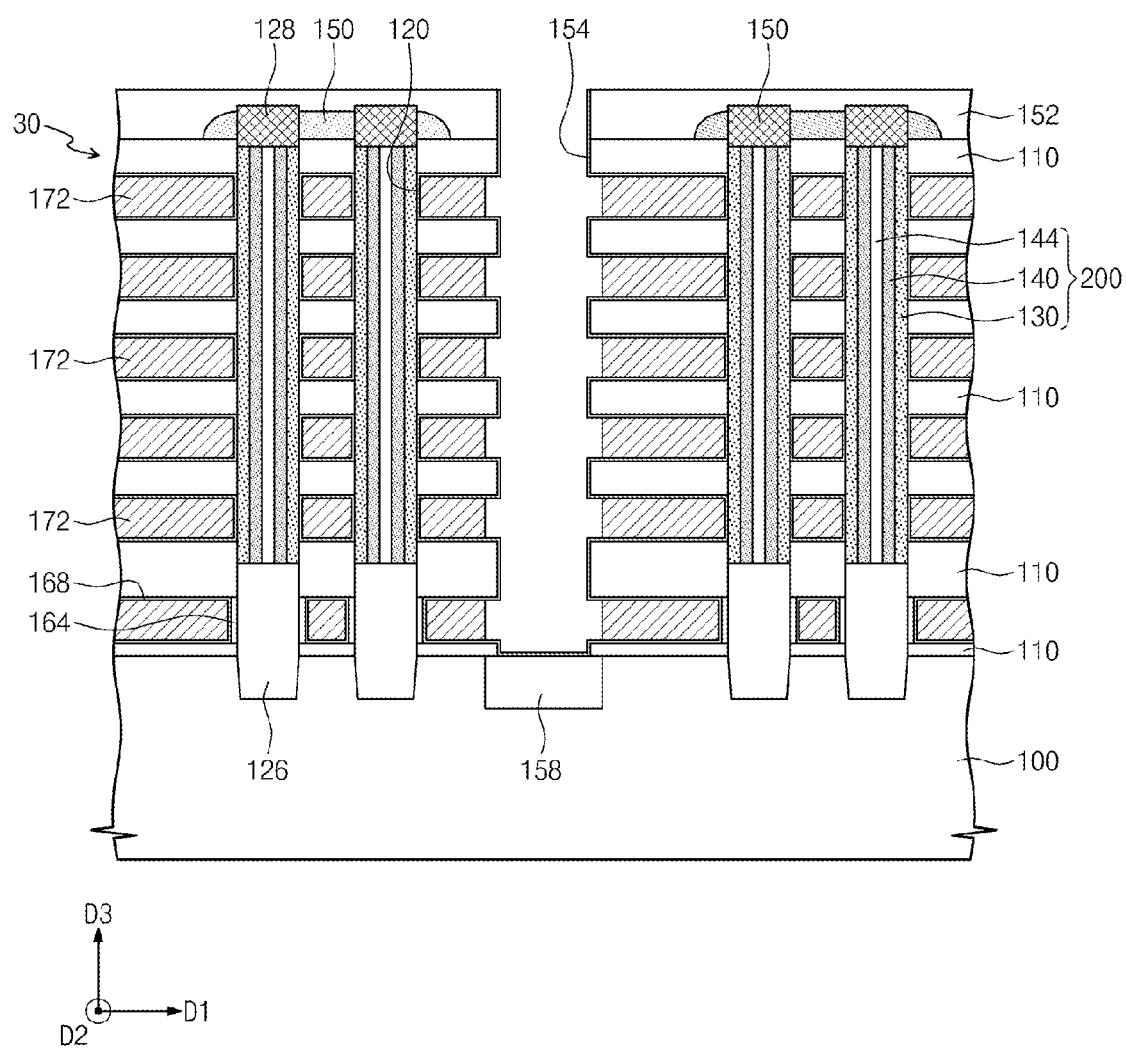

Referring to FIG. 15, a second blocking layer 168 and gate electrodes 172 may be sequentially formed to fill the opening regions 160. The second blocking dielectric layer 168 may be formed to cover inner surfaces of the opening regions 160. The second blocking dielectric layer 168 may be conformally formed on the inner surfaces of the opening regions 160. For example, the second blocking dielectric layer 168 may be in contact with top and bottom surfaces of the insulating layers 110. The second blocking dielectric layer 168 may be in contact with the sidewalls of the vertical channel structures 200. For example, the second blocking dielectric layer 168 may be in contact with the first blocking dielectric layer 132 of FIG. 10. In addition, the second blocking dielectric layer 168 may include high-k dielectric (e. g., an aluminum oxide layer, or hafnium oxide layer). In other embodiments, the second blocking dielectric layer 168 may be omitted depending on the applications.

The gate electrodes 172 may be formed to fill the opening regions 160 in which the second blocking layer 168 is formed. For example, a gate conductive layer may be formed to fill the opening regions 160 in which the second blocking layer 168 is formed and may be isotropically etched. Thus, the gate electrodes 172 may be formed to be stacked and be isolated from each other in third direction. The gate electrodes 172 may be separated by the trench 154 in the first direction. As a result, stack structures 30 may be formed on the substrate 100. Each of the stack structures 30 may include the insulating layers 110 and the gate electrodes 172 which are alternately and repeatedly stacked on the substrate 100. Each of the gate electrodes 172 may include a conductive layer including metal. For example, each of the gate electrodes may include a metal layer, a metal silicide layer, and/or a metal nitride layer. For example, the metal layer may include nickel, cobalt, platinum, titanium, tantalum, and/or tungsten. For example, the metal silicide layer may include nickel silicide, cobalt silicide, platinum silicide, titanium silicide, tantalum silicide, or tungsten silicide. For example, the metal nitride layer may include titanium nitride, tungsten nitride, or tantalum nitride.

Figure 16:
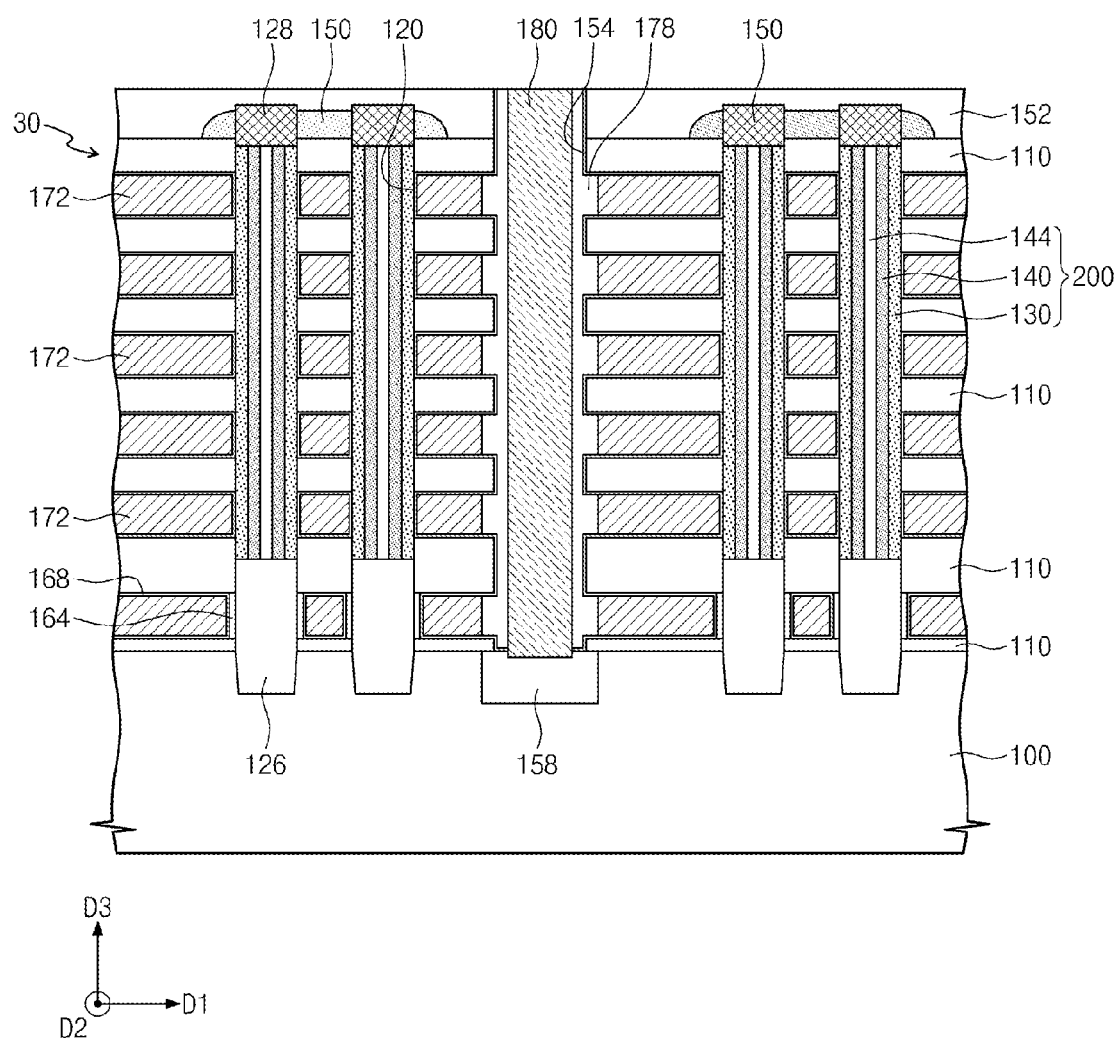

Referring to FIG. 16, an isolation insulating layer 178 and a common source plug 180 may be formed in the trench 154 between the stack structures 30. For example, the isolation insulating layer 178 may be a liner-shaped pattern formed in the trench 154. The isolation insulating layer 178 may include a silicon nitride layer, a silicon oxide layer, and/or silicon oxynitride layer.

The common source plug 180 may be formed to fill the trench 154 in which the isolation insulating layer 178 is formed. The common source plug 180 may be in contact with the common source region 158. The common source plug 180 may have an island shape. In this case, a plurality of common source plugs 180 may be arranged in the second direction. Alternatively, the common source plug 180 may have a line shape extending in the second direction. The common source plug 180 may include, for example, polysilicon, or metal (e. g., tungsten, or copper).

Figure 17:
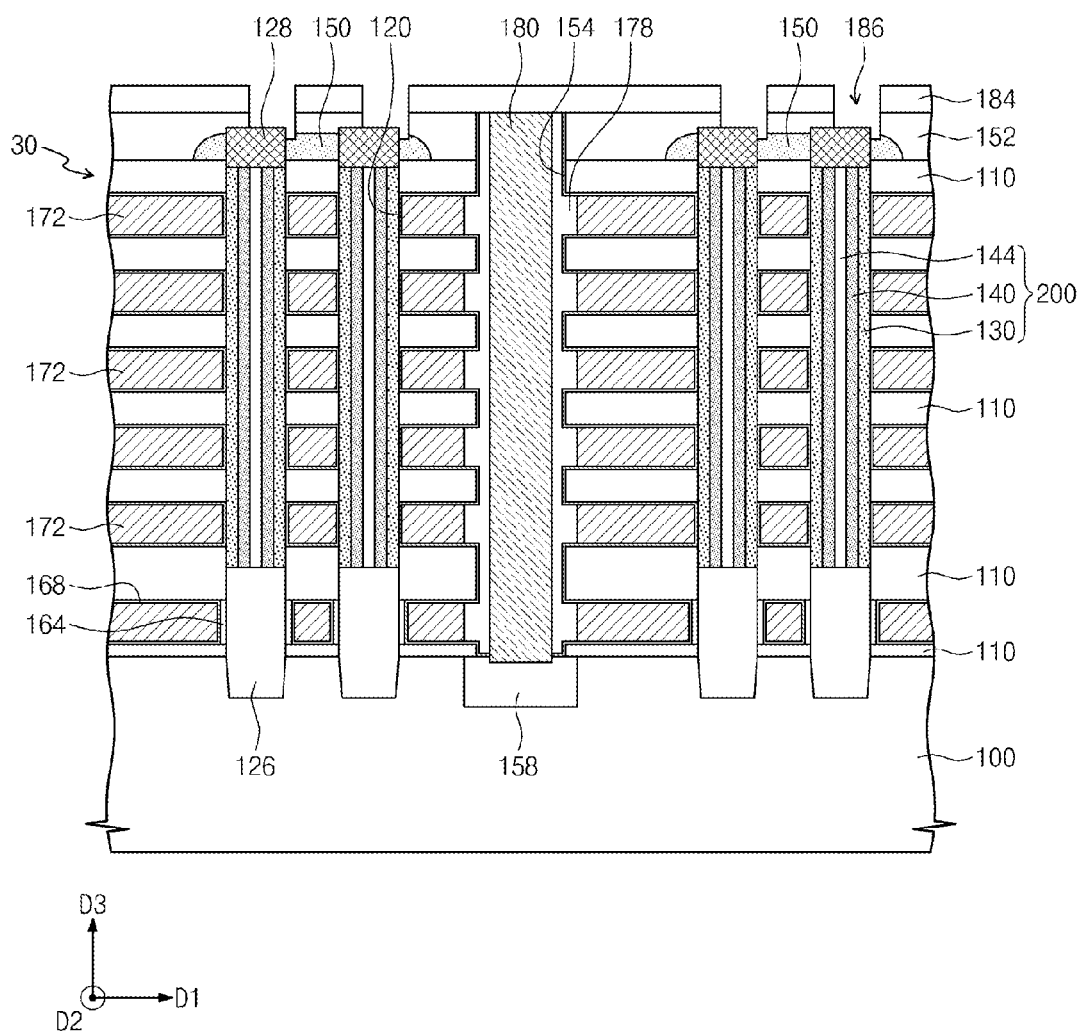

Referring to FIG. 17, an upper interlayer insulating layer 184 covering the common source plug 180 and pad contact holes 186 exposing the conductive pads 128 may be formed. The upper interlayer insulating layer 184 may be formed on the capping insulation layer 152 to cover the common source plug 180. The upper interlayer insulating layer 184 may include, for example, silicon oxide.

Pad contact holes 186 may be formed to penetrate the upper interlayer insulating layer 184 and the capping insulation layer 152, thereby exposing at least a portion of the conductive pads 128. For example, the pad contact holes 186 may be formed by etching the upper interlayer insulating layer 184 and the capping insulation layer 152. When the pad contact holes 186 may be formed, the pad contact holes 186 may be formed to be misaligned with the conductive pads 128 due to, for example, physical variations of the vertical channel structures 200 (e. g., the vertical channel structures 200 being lopsided). Thus, sidewalls of the conductive pads 128 may be exposed. In addition, a portion of the etch stopper 150 may be further etched, thereby enlarging the exposed area of sidewalls of the conductive pads 128.

When the capping insulation layer 152 is etched, the etch stopper 150 may substantially prevent the uppermost insulating layer 110 from being etched, thereby substantially protecting the uppermost gate electrode 172 from being exposed. Therefore, shorts or bridges between pad contacts 188 and the uppermost gate electrode 172 may be prohibited.

Figure 18:
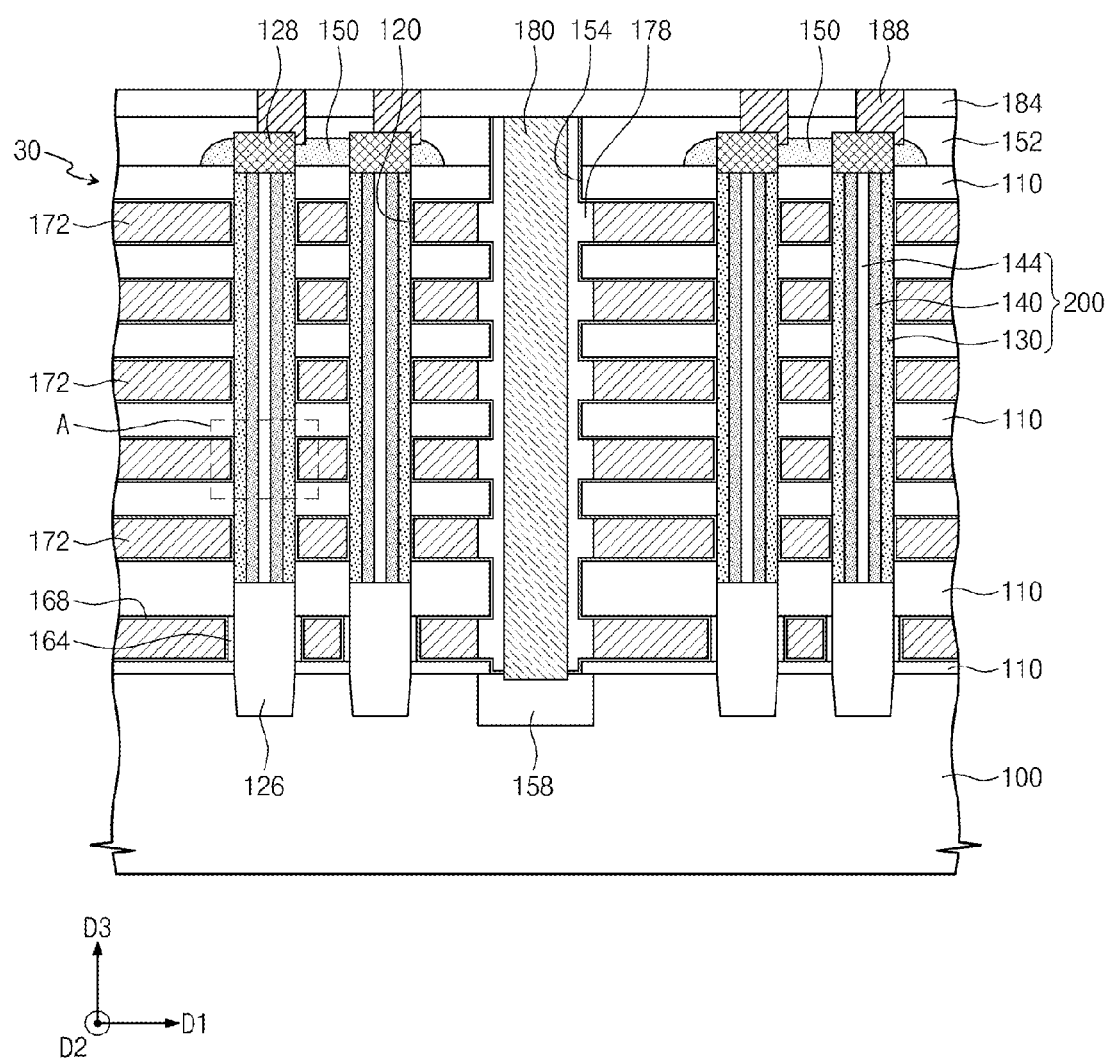

Referring to FIG. 18, pad contacts 188 may be connected to the conductive pads 128. The pad contacts 188 may penetrate the upper interlayer insulating layer 184 and the capping insulation layer 152 to be in contact with the conductive pads 128. For example, a conductive material may be deposited to fill the pad contact holes 186 and may be planarized using an etch-back process or a chemical mechanical polishing (CMP) process, thereby forming the pad contact 188 in each of the pad contact holes 186. Each pad contact 188 may be in contact with a top surface and sidewalls of each of the conductive pads 128 to secure a sufficient contact area. Each of the pad contacts 188 may include a conductive material such as metal, metal nitride, and/or doped polysilicon. The pad contacts 188 may be connected to a bit line (not shown) formed on the upper interlayer insulating layer 184.

As described above, according to example embodiment of the inventive concepts, high-quality and a highly-reliable semiconductor devices can be formed by substantially preventing the shorts or the bridges between the pad contacts 188 and the conductive pads 128

Figure 19:
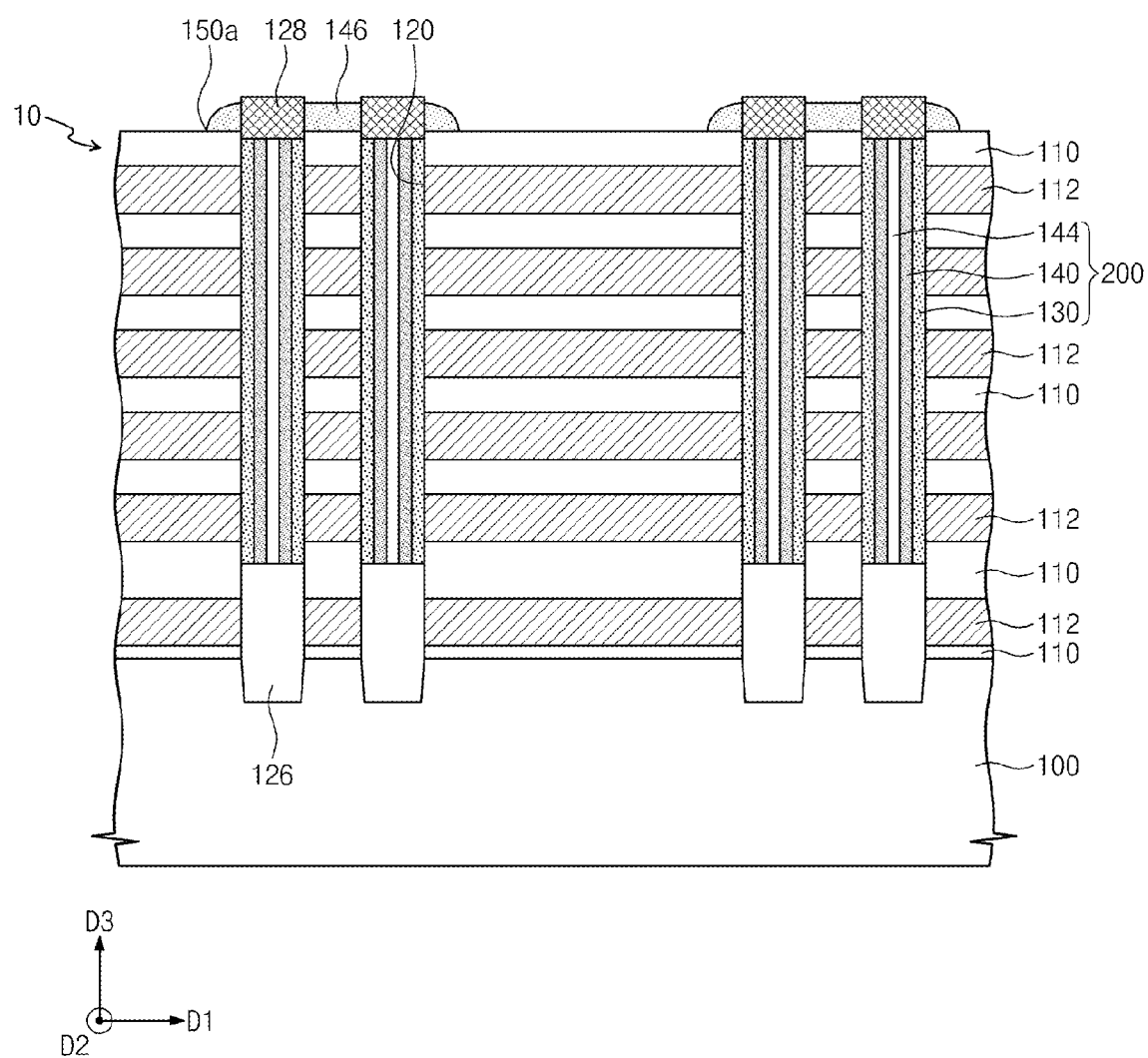
FIGS. 19 to 21 are cross-sectional views taken along line I-I' of FIG. 1 to illustrate some processes of a method of fabricating the semiconductor memory device of FIG. 4.
Figure 20:
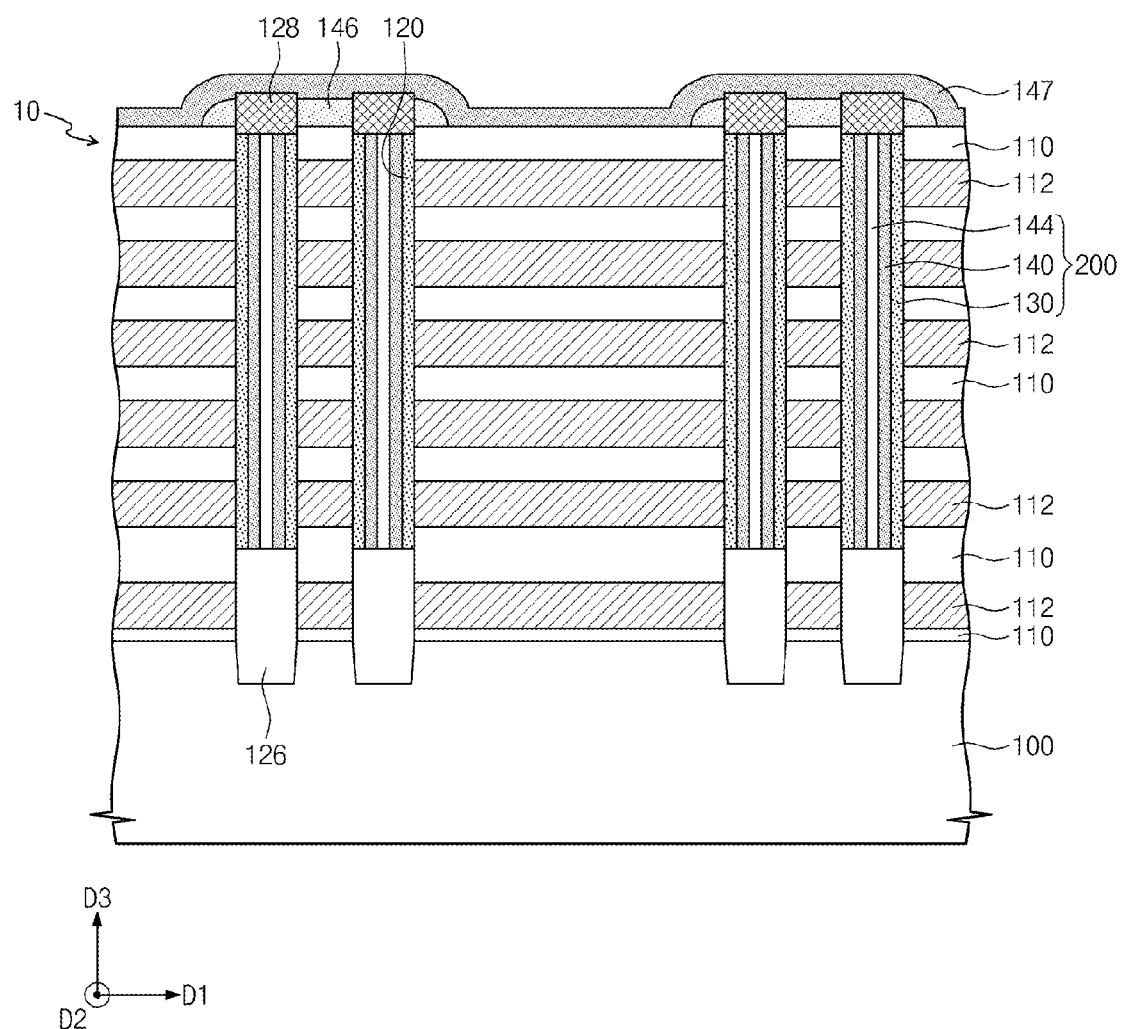
Figure 21:
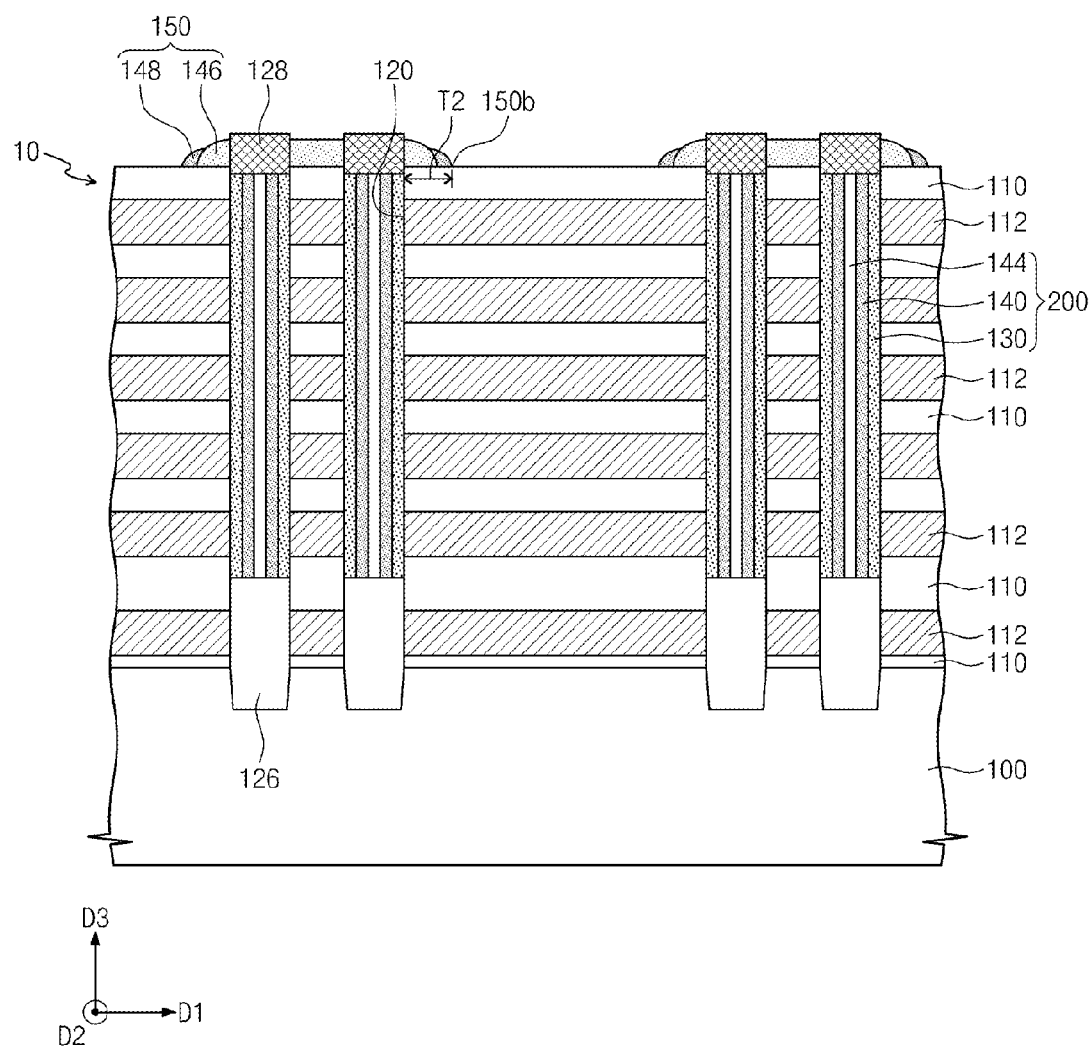

FIGS. 19 to 21 are cross-sectional views taken along line I-I' of FIG. 1 to illustrate some processes of a method of fabricating the semiconductor memory device of FIG. 4 according to some embodiments.

In a method of fabricating a semiconductor memory device according to the present embodiment, processes, which include from a process of forming a molding structure 10 to a process of forming the conductive pads 128, may be the same as the processes described with reference to FIGS. 7 to 11, and thus, the descriptions thereto will be omitted. In addition, the descriptions to the same processes as described with reference to FIGS. 12 to 18 will be omitted or mentioned briefly in the present embodiment. In other words, differences between the present embodiment and the aforementioned embodiment will be mainly described hereinafter.

Referring to FIG. 19, a first etch stopper pattern 146 may be formed on the sidewalls of the conductive pads 128. For example, the etch stopper layer 145 may be etched back to form the first etch stopper pattern 146 that has a spacer shape on the sidewalls of the conductive pads 128. The first etch stopper pattern 146 may fill the space between the inner sidewalls of the conductive pads 128 and be formed with a spacer shape on the outer sidewalls of the conductive pads 128. Thus, the top surfaces and portions of the sidewalls of the conductive pads 128 may be exposed.

Referring to FIG. 20, a supplemental etch stopper layer 147 may be formed on the uppermost insulating layer 110 to cover the first etch stopper pattern 146 and the conductive pads 128. The supplemental etch stopper layer 147 may be formed of the same material as the etch stopper layer 145. For example, the supplemental etch stopper layer 147 may include silicon nitride.

Referring to FIG. 21, the second etch stopper pattern 148 may be formed on sidewalls of the first etch stopper pattern 146. For example, the supplemental etch stopper layer 147 may be etched back to form the second etch stopper pattern 148 on the sidewalls of the first etch stopper pattern 146. The etch-back process may be performed to remove a portion of the supplemental etch stopper layer 147 disposed on the top surfaces of the conductive pads 128 and the top surface of the first etch stopper pattern 146. As a result, an etch stopper 150 including the first etch stopper pattern 146 and the second etch stopper pattern 148 may be formed. The size of the etch stopper pattern 150 of the present embodiment may be greater than that of the etch stopper 150 illustrated in FIG. 12. For example, a perimeter 150b of the etch stopper 150 (e g., a perimeter of the second etch stopper pattern 148) may be laterally spaced apart from the outer sidewalls of the conductive pads 128 by a second distance T2. The second distance T2 may be greater than the first distance T1. Thus, an area where the uppermost insulating layer 110 is protected by the etch stopper 150 may be enlarged. As a result, each of the pad contact holes 186 of FIG. 17 to be formed in the following step may be formed in a considerable magnitude of alignment margin to each of the conductive pads 128 and may be formed to have a greater size. Accordingly, the reliability of the semiconductor memory device may be improved.

In some embodiments, the etch stopper 150 may include two or more etch stopper patterns. For example, a process, in which the etch stopper layer are formed on the conductive pads 128 and may be etched back, may be alternately repeated. Thus, a plurality of the etch stopper patterns may be formed on the sidewalls of the conductive pads 128. Next, the same processes described with reference to FIGS. 13 to 18 may be performed.

Figure 22:
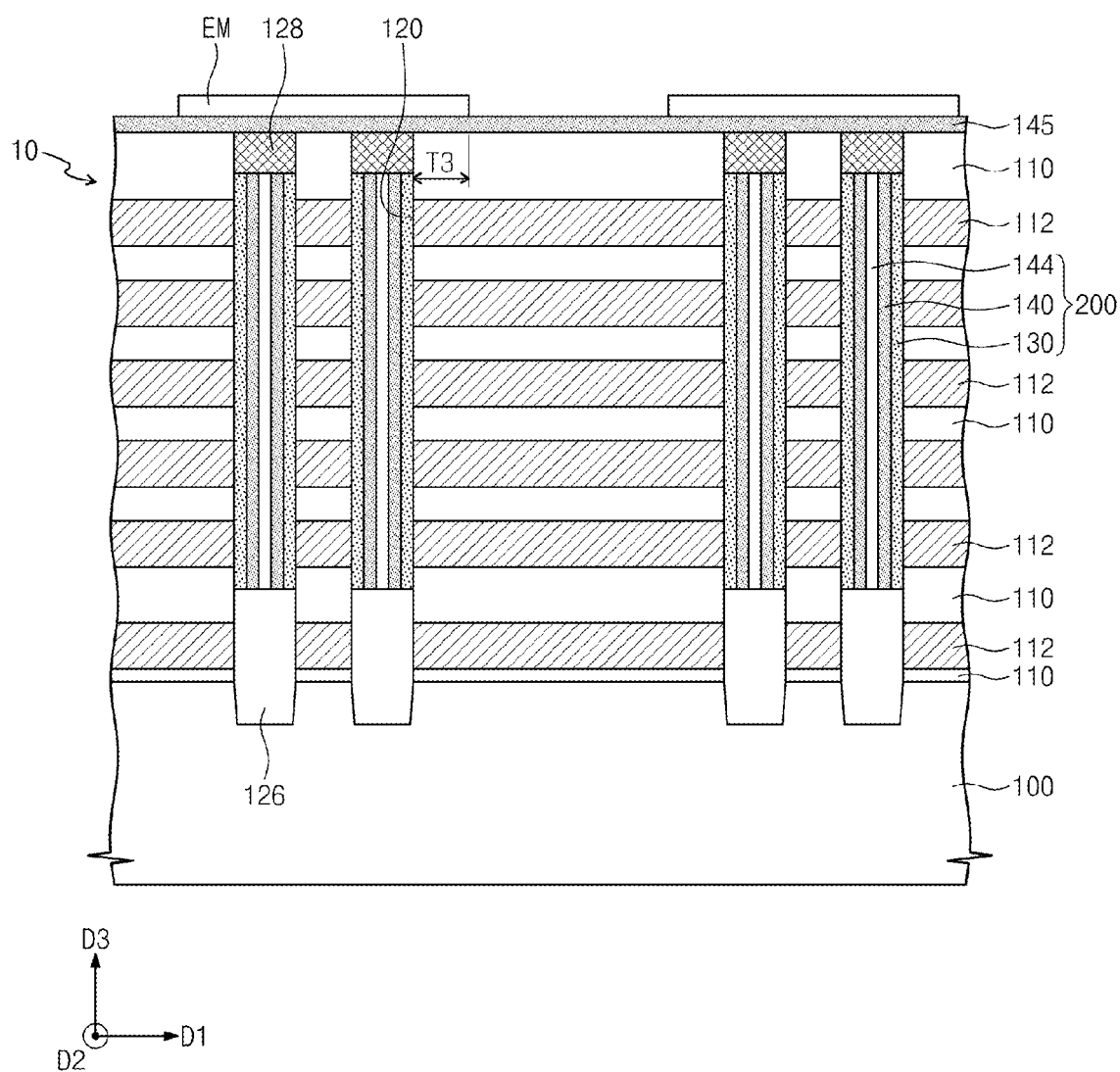
FIGS. 22 and 23 are cross-sectional views taken along line II-II' of FIG. 5 to illustrate some processes of a method of fabricating the semiconductor memory device of FIGS. 5 and 6.
Figure 23:
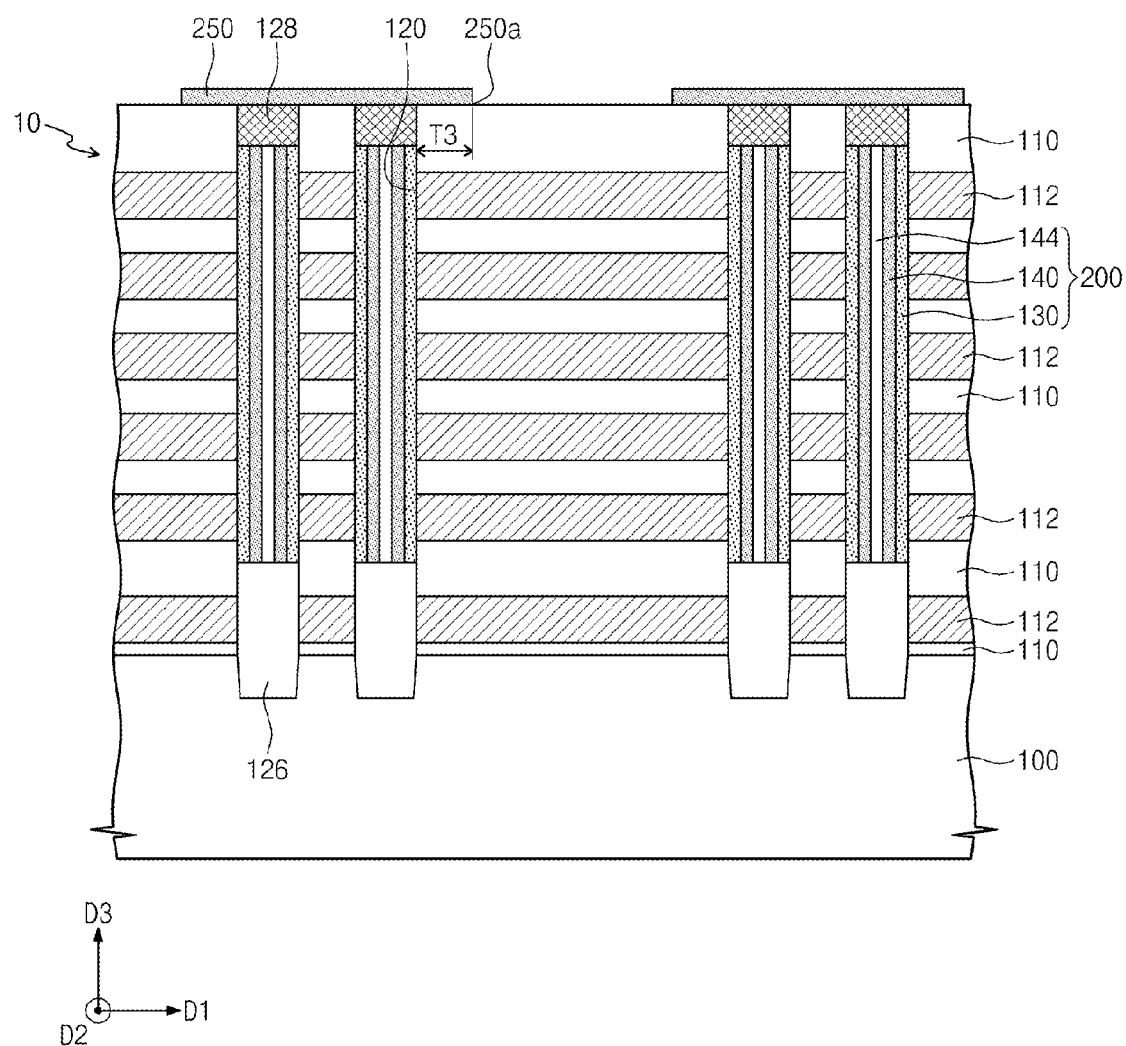

FIGS. 22 and 23 are cross-sectional views taken along line II-II' of FIG. 5 to illustrate some processes of a method of fabricating the semiconductor memory device of FIGS. 5 and 6. In a method of fabricating a semiconductor memory device according to the present embodiment, processes, which include from a process of forming a molding structure 10 to a process of forming the conductive pads 128, may be the same as the processes described with reference to FIGS. 7 to 10, and thus, the descriptions thereto will be omitted. In addition, the descriptions to the same processes as described with reference to FIGS. 11 to 18 will be omitted or mentioned briefly in the present embodiment. In other words, differences between the present embodiment and the aforementioned embodiment will be mainly described hereinafter.

Referring to FIG. 22, an etch stopper layer 145 may be formed to cover the conductive pads 128. The etch stopper layer 145 may be formed on the molding structure 10. For example, the etch stopper layer 145 may be conformally formed on the molding structure 10. The top surface of the uppermost insulating layer 110 of the molding structure 10 may be substantially coplanar with the top surfaces of the conductive pads 128. In some embodiments, a portion of the uppermost insulating layer 110 may be removed and the sidewall of the conductive pads 128 may be exposed. An etch mask pattern EM may be formed on the etch stopper layer 145. The etch mask pattern EM may be, for example, a photoresist pattern. The etch mask pattern EM may have sidewalls horizontally spaced apart from the outer sidewalls of the conductive pads by at least a third distance T3. For example, the etch mask pattern EM may be a pattern having a linear perimeter spaced apart from the sidewalls of the conductive pads 128 formed on each of the vertical channel structures 200 arranged along the first column 200a and each of the vertical channel structures 200 arranged along the fourth column 200d illustrated in FIG. 5, by the third distance T3.

Referring to FIG. 23, an etch stopper 250 may be formed to cover the top surface of the conductive pads 128. For example, the etch stopper layer 145 may be patterned using the etch mask pattern EM so as to form etch stopper 250. The etch stopper 250 may have a perimeter 250a laterally spaced apart from the outer sidewalls of the conductive pads 128 by a third distance T3. The third distance T3 may be the same as any one of the first and second distances T1 and T2 illustrated in FIGS. 12 and 21, or greater than the first and second distances T1 and T2. Thus, an area where the uppermost insulating layer 110 is protected by the etch stopper 250 may be enlarged. As a result, each of the pad contact holes 186 of FIG. 17 to be formed in the following step may be formed in a considerable magnitude of alignment margin to each of the conductive pads 128 and may be formed to have a greater size. Accordingly, the reliability of the semiconductor memory device according to the present embodiment may be improved.

Next, the same or similar processes described with reference to FIGS. 13 to 18 may be performed.

Figure 24:
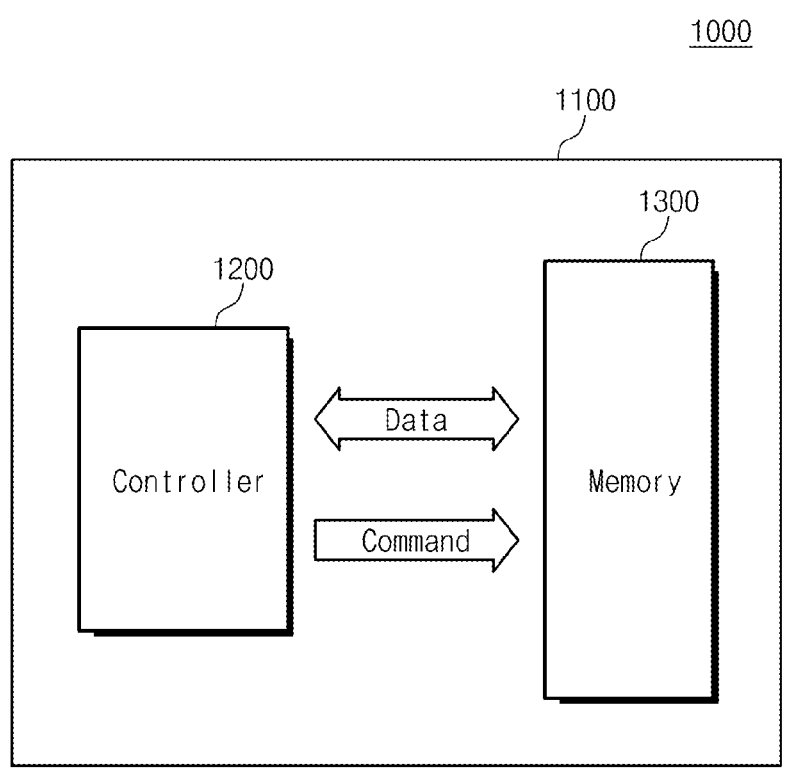
FIG. 24 is a schematic block diagram illustrating a semiconductor memory system including a semiconductor memory device according to example embodiments of the inventive concepts.

FIG. 24 is a schematic block diagram illustrating a semiconductor memory system including a semiconductor memory device according to embodiments of the inventive concepts.

Referring to FIG. 20, a memory system 1000 according to some embodiments of the inventive concepts may be a semiconductor storage device. For example, the memory system 1000 may be a memory card or a solid state drive (SSD). The memory system 1000 may include a controller 1200 and a memory device 1300 which are disposed in a housing 1100. The controller 1200 may exchange electrical signals with the memory device 1300. For example, the controller 1200 may exchange data with the memory device 1300 in response to a command. Thus, the memory system 1000 may store data in the memory device 1300 or may output data from the memory device 1300 to an external system. The memory device 1300 may include at least one of the semiconductor memory devices according to embodiments of the inventive concepts.

Figure 25:
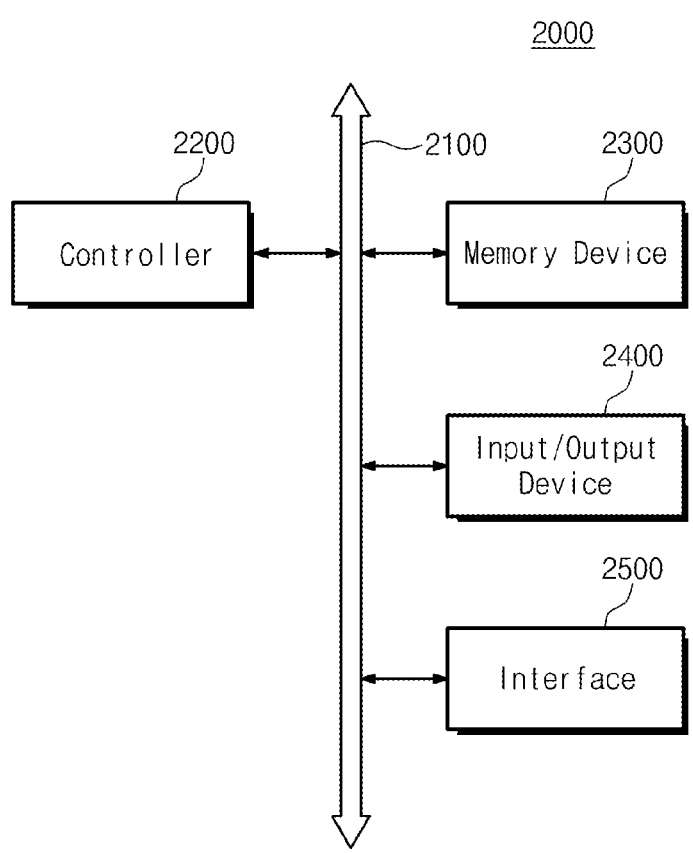
FIG. 25 is a schematic block diagram illustrating an electronic system including a semiconductor memory device according to example embodiments of the inventive concepts.

FIG. 25 is a schematic block diagram illustrating an electronic system including a semiconductor memory device according to embodiments of the inventive concepts.

Referring to FIG. 25, an electronic system 2000 may include a controller 2200, a memory device 2300, and an input/output device 2400. The controller 2200, the memory device 2300, and the input/output device 2400 may be coupled to each other through a data bus 2100. The data bus 2100 may correspond to a path that transmits data. For example, the controller 2200 may include at least one of a microprocessor, a digital signal processor, a microcontroller, or other logic devices. Functions of the other logic devices may be similar to any one of the microprocessor, the digital signal processor and the microcontroller. The input/output device 2400 may include at least one of a keypad, a keyboard, or a display device. The memory device 2300 is a device that stores data. The memory device 2300 may store data and/or commands to be executed by the controller 2200. The memory device 2300 may include a volatile memory device and/or a non-volatile memory device. Alternatively, the memory device 2300 may include a flash memory device. The flash memory device may be used to implement a solid state drive (SSD). In this case, the electronic system 2000 may stably store massive data in the memory device 2300. The memory device 2300 may include at least one of the semiconductor memory devices according to embodiments of the inventive concepts. The electronic system 2000 may further include an interface unit 2500 that transmits data to a communication network or receives data from a communication network. The interface unit 2500 may operate by wireless or cable. For example, the interface unit 2500 may include an antenna or a wireless/cable transceiver.

According to example embodiments of the inventive concepts, the conductive pads may be disposed on the vertical channel structures penetrating the stack structure which include the insulating layers and the gate electrodes which are alternately and repeatedly stacked on the substrate. The etch stopper may be disposed on the sidewalls of the conductive pads. The etch stopper may be an isolated pattern to be disposed on the stack structure and may cover sidewalls of the conductive pads. The pad contacts may be disposed on the conductive pads and be connected to the conductive pads. Even if the misalignment between the pad contacts and the conductive pads is occurred, the etch stopper may substantially prevent the shorts or the bridge from occurring between the pad contacts and the uppermost gate electrode. Thus, the highly-reliable semiconductor memory device can be formed.

According to example embodiments of the inventive concepts, the conductive pads may be formed on the vertical channel structures penetrating the stack structure which include the insulating layers and the gate electrodes which are alternately and repeatedly stacked on the substrate. The etch stopper may be formed on the sidewalls of the conductive pads and the insulation layer may be formed to cover the conductive pads and the etch stopper. The pad contact holes in which the pad contacts are formed may be formed by etching the insulation layer. At this time, even if the pad contact holes is misaligned with the conductive pads, the etch stopper may prevent the uppermost insulating layer of the stack structure from being etched. Accordingly, since the uppermost gate electrode of the stack structure may not be exposed, thereby substantially preventing the shorts or the bridge from occurring between the pad contacts and the uppermost gate electrode. As a result, highly-reliable semiconductor memory device can be fabricated.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device, comprising:
stack structures arranged in a first direction, each of the stack structures including insulating layers and gate electrodes that are alternately and repeatedly stacked on a substrate;
vertical channel structures each penetrating a corresponding one of the stack structures;
conductive pads in contact with the vertical channel structures, each of the conductive pads disposed on a corresponding one of the vertical channel structures; and
an etch stopper covering sidewalls of the conductive pads, exposing top surfaces of the conductive pads, and formed on a top surface of an uppermost insulating layer of the insulating layers of the stack structures,
wherein the etch stopper is an isolated pattern on a corresponding one of the stack structures.

2. The semiconductor memory device of claim 1, wherein each of the vertical channel structures comprises a tunnel dielectric layer, a charge storage layer, and a vertical channel pattern.

3. The semiconductor memory device of claim 2, wherein the vertical channel pattern comprises a first vertical channel pattern protruding upwardly from the substrate and a second vertical channel pattern on the first vertical channel pattern, and
wherein the tunnel dielectric layer and the charge storage layer are disposed between the second vertical channel pattern and the stack structures.

4. The semiconductor memory device of claim 1, wherein the etch stopper has a perimeter in plan view including at least one non-linear side.

5. The semiconductor memory device of claim 1, wherein the etch stopper comprises silicon nitride.

6. The semiconductor memory device of claim 1, wherein, for a group of multiple conductive pads of the conductive pads on a stack structure of the stack structures, the etch stopper fills a space between the group of the conductive pads and fills a space from the group of the conductive pads to a perimeter surrounding the group of the conductive pads.

7. The semiconductor memory device of claim 1, wherein the etch stopper includes a plurality of etch stopper patterns on outer sidewalls of the conductive pads.

8. The semiconductor memory device of claim 1, further comprising pad contacts in contact with the conductive pads and the etch stopper.

9. A semiconductor memory device, comprising:
stack structures arranged in a first direction, each of the stack structures including insulating layers and gate electrodes that are alternately and repeatedly stacked on a substrate;
vertical channel structures each penetrating a corresponding one of the stack structures;
conductive pads in contact with the vertical channel structures, each of the conductive pads disposed on a corresponding one of the vertical channel structures; and
a trench extending in a second direction crossing the first direction between adjacent ones of the stack structures;
a common source plug in the trench; and
an etch stopper on each of the stack structures, each etch stopper being an isolated pattern horizontally spaced apart from the trench, covering a portion of the conductive pads in the first and second directions, and formed on a top surface of an uppermost insulating layer of the insulating layers of the corresponding one of the stack structures.

10. The semiconductor memory device of claim 9, wherein each of the vertical channel structures comprises a first vertical channel pattern protruding upwardly from the substrate, a second vertical channel pattern on the first vertical channel pattern, a tunnel dielectric layer, a charge storage layer and a blocking insulating layer, and
wherein the tunnel dielectric layer, the charge storage layer and the blocking insulating layer are disposed between the second vertical channel pattern and the stack structures.

11. The semiconductor memory device of claim 9, wherein the etch stopper covers sidewalls of the conductive pads and has a perimeter in plan view including at least one non-linear side.

12. The semiconductor memory device of claim 9, wherein the etch stopper covers top surfaces of the conductive pads and has a linear perimeter in plan view.

13. The semiconductor memory device of claim 9, further comprising pad contacts in contact with the conductive pads and the etch stopper.

14. The semiconductor memory device of claim 13, wherein each of the pad contacts is in contact with a top surface and sidewalls of each of the conductive pads and a portion of the etch stopper.

15. The semiconductor memory device of claim 9, wherein, for a group of multiple conductive pads of the conductive pads on a stack structure of the stack structures, the etch stopper fills a space between the group of the conductive pads and fills a space from the group of the conductive pads to a perimeter surrounding the group of the conductive pads.

16. A device, comprising:
stack structures formed on a semiconductor substrate, the stack structures each including insulating layers and gate electrodes alternately and repeatedly stacked on the semiconductor substrate;
vertical channel structures penetrating the stack structures, each stack structure being penetrated by at least two of the vertical channel structures;
conductive pads each disposed on a corresponding one of the vertical channel structures;
pad contacts each overlying and contacting a corresponding one of the conductive pads; and
etch stoppers each disposed on a corresponding one of the stack structures and covering sidewalls of the conductive pads on the corresponding one of the stack structures, and formed on a top surface of an uppermost insulating layer of the insulating layers of the corresponding one of the stack structures,
wherein adjacent ones of the etch stoppers are spaced apart from each other, and for each of the etch stoppers, the etch stopper extends from the corresponding conductive pads such that a perimeter of the etch stopper in plan view is disposed offset from outer conductive pads of the corresponding conductive pads by a distance.

17. The device of claim 16, wherein the etch stoppers are in contact with the pad contacts.

18. The device of claim 16, wherein the pads contacts and the conductive pads are misaligned with each other.

19. The device of claim 16, wherein some of the vertical channel structures are arranged in a zigzag form in plan view.

20. The semiconductor memory device of claim 1, further comprising:
   a capping insulating layer covering the etch stopper and contacting the conductive pads;
   an upper insulating layer formed on the capping insulating layer; and
   pad contacts contacting the conductive pads and penetrating the capping insulating layer and the upper insulating layer.

* * * * *